(12) United States Patent
Wojnowski et al.

(10) Patent No.: US 8,952,521 B2
(45) Date of Patent: Feb. 10, 2015

(54) SEMICONDUCTOR PACKAGES WITH INTEGRATED ANTENNA AND METHOD OF FORMING THEREOF

(71) Applicant: Infineon Technologies AG, Neubiberg (DE)

(72) Inventors: Maciej Wojnowski, Munich (DE); Walter Hartner, Bad Abbach (DE); Ottmar Geitner, Pentling (DE); Gottfried Beer, Nittendorf (DE); Klaus Pressel, Regensburg (DE); Mehran Pour Mousavi, Munich (DE)

(73) Assignee: Infineon Technologies AG, Neubiberg (DE)

( * ) Notice: Subject to any disclaimer, the term of this patent is extended or adjusted under 35 U.S.C. 154(b) by 16 days.

(21) Appl. No.: 13/736,553

(22) Filed: Jan. 8, 2013

(65) Prior Publication Data

US 2014/0110840 A1  Apr. 24, 2014

(30) Foreign Application Priority Data

Oct. 19, 2012  (EP) .................................... 12007249

(51) Int. Cl.
| | |
|---|---|
| *H01L 23/04* | (2006.01) |
| *H01L 23/66* | (2006.01) |
| *H01L 21/768* | (2006.01) |
| *H01L 23/498* | (2006.01) |
| *H01Q 1/22* | (2006.01) |

(Continued)

(52) U.S. Cl.
CPC .... *H01L 23/49816* (2013.01); *H01L 21/76885* (2013.01); *H01L 21/76802* (2013.01); *H01L 23/49827* (2013.01); *H01Q 1/2283* (2013.01); *H01Q 9/0407* (2013.01); *H01Q 9/16* (2013.01); *H01Q 23/00* (2013.01); *H01L 2924/0002* (2013.01); *H01L 23/3128* (2013.01)
USPC ........... 257/698; 257/675; 257/693; 257/728; 257/773; 257/E23.141; 257/E23.142; 257/E23.168; 438/106; 438/124

(58) Field of Classification Search
USPC ......... 257/666–677, 693, 698, 723, 728, 773, 257/E23.001–E23.194, 828, E23.141, 257/E23.142, E23.168; 438/106, 111, 112, 438/124
See application file for complete search history.

(56) References Cited

U.S. PATENT DOCUMENTS

| | | | |
|---|---|---|---|
| 7,692,588 B2 | 4/2010 | Beer et al. | |
| 8,067,253 B2 | 11/2011 | Ferguson et al. | |

(Continued)

FOREIGN PATENT DOCUMENTS

| | | |
|---|---|---|
| DE | 10 2004 027 788 A1 | 1/2006 |
| DE | 10 2005 043 557 B4 | 3/2007 |

OTHER PUBLICATIONS

Akkermans, J., et al., "Antennas and Packaging for millimeter-wave phased-array transceivers," The European Microwave Conference, 2008, 34 pages.

(Continued)

*Primary Examiner* — Jasmine Clark
(74) *Attorney, Agent, or Firm* — Slater & Matsil, L.L.P.

(57) ABSTRACT

In one embodiment of the present invention, a semiconductor package includes a substrate having a first major surface and an opposite second major surface. A chip is disposed in the substrate. The chip includes a plurality of contact pads at the first major surface. A first antenna structure is disposed at the first major surface. A reflector is disposed at the second major surface.

28 Claims, 16 Drawing Sheets

(51) Int. Cl.
*H01Q 9/04* (2006.01)
*H01Q 9/16* (2006.01)
*H01Q 23/00* (2006.01)
*H01L 23/31* (2006.01)

(56) References Cited

U.S. PATENT DOCUMENTS

| 8,278,749 | B2 | 10/2012 | Lachner et al. |
| 8,411,444 | B2 | 4/2013 | Gaynes et al. |
| 2008/0029886 | A1* | 2/2008 | Cotte et al. ............ 257/728 |
| 2010/0193935 | A1 | 8/2010 | Lachner et al. |
| 2012/0049375 | A1 | 3/2012 | Meyer et al. |

OTHER PUBLICATIONS

Gadfort, P., et al., "Design, Modeling, and Fabrication of mm$^3$ Three-dimensional Intergrated Antennas," IEEE, 2012, pp. 1794-1799.
Laskar, J., et al., "The Next Wireless Wave is a Millimeter Wave," Cover Feature, vol. 50 No. 8, Aug. 2007, 13 pages.
Yang. Y., et al., "Design of Compact Vivaldi Antenna Arrays for UWB See Through Wall Applications", Progress in Electromagnetics Research, PIER 82, 2008, pp. 401-418.

* cited by examiner

SEMICONDUCTOR PACKAGES WITH INTEGRATED ANTENNA AND METHOD OF FORMING THEREOF

This application claims priority to European Patent Application 12007249.1, which was filed Oct. 19, 2012 and is incorporated herein by reference.

CROSS-REFERENCE TO RELATED APPLICATIONS

The application relates to the following co-pending and commonly assigned patent applications: Ser. No. 13/736,097, filed Jan. 8, 2013; and Ser. No. 13/736,641, filed Jan. 8, 2013, which applications are incorporated herein by reference.

TECHNICAL FIELD

The present invention relates generally to semiconductor packages, and more particularly to semiconductor packages with integrated antenna and methods of forming thereof.

BACKGROUND

Recently, interest in the millimeter-wave spectrum at 10 GHz to 300 GHz has drastically increased. The emergence of low cost high performance CMOS technology has opened a new perspective for system designers and service providers because it enables the development of millimeter-wave radios at the same cost structure of radios operating in the gigahertz range or less. In combination with available ultra-wide bandwidths, this makes the millimeter-wave spectrum more attractive than ever before for supporting a new class of systems and applications ranging from ultra-high speed data transmission, video distribution, portable radar, sensing, detection and imaging of all kinds. However, taking advantage of this spectrum requires the ability to design and manufacture reliable, low cost, efficient antennas operating with millimeter-wave semiconductor devices.

In millimeter wave systems, such as, e.g., radars for automotive safety and comfort, antenna structures are placed on high frequency substrates or high frequency printed circuit boards (HF PCBs). Antennas such as microstrip antennas (e.g., patch antennas) are often built on these special high frequency substrates. HF PCBs are often constructively based on Rogers, Taconic or other PTFE materials. However, such construction increases the overall cost due to the extra high expense of such high frequency substrates and their assembly.

Millimeter wave output power can be generated on a semiconductor monolithic microwave integrated circuit (MMIC), which may be located also on the HF PCB. The inputs and outputs on MMIC devices frequently match to a characteristic impedance (e.g. 50 ohms) and interconnect to an antenna. These interconnections between MMIC devices and antenna generally involve a lossy chip/board interface (e.g., bond wires).

Therefore, there is a demand for efficient, less expensive, and cost-effective antenna packages for millimeter wave applications.

SUMMARY OF THE INVENTION

In accordance with an embodiment of the present invention, a semiconductor package comprises a substrate having a first major surface and an opposite second major surface. A first chip is disposed in the substrate. The first chip comprises a plurality of contact pads at the first major surface. A first antenna structure is disposed in the substrate. A reflector is disposed in the substrate.

In accordance with an alternative embodiment of the present invention, a semiconductor system comprises a semiconductor package and a printed circuit board. The semiconductor package comprises a substrate comprising an encapsulant. The substrate has a first major surface and an opposite second major surface. A chip is disposed in the substrate. The chip comprises a plurality of contact pads at the first major surface. A first antenna structure is proximate the first major surface. A reflector is proximate the second major surface. A plurality of external contacts is disposed at the second major surface. The printed circuit board has a front side and back side. The printed circuit board comprises contact pads at the front side electrically coupled to the plurality of external contacts. The front side faces the second major surface of the semiconductor package.

In accordance with an alternative embodiment of the present invention, a method of forming a semiconductor package comprises forming a reconstituted substrate comprising a chip embedded in an encapsulant. The reconstituted substrate comprises a first major surface and an opposite second major surface. The chip comprises a plurality of contact pads at the first major surface. A front side redistribution layer is formed over the first major surface of the reconstituted substrate. The front side redistribution layer comprises an antenna structure. A back side redistribution layer is formed under the second major surface of the reconstituted substrate. The back side redistribution layer comprises a reflector.

In accordance with an alternative embodiment of the present invention, a method of forming a semiconductor package comprises forming a substrate having a first major surface and an opposite second major surface. The substrate comprises a chip which including a plurality of contact pads at the first major surface. A antenna structure and a reflector are formed in the substrate.

BRIEF DESCRIPTION OF THE DRAWINGS

For a more complete understanding of the present invention, and the advantages thereof, reference is now made to the following descriptions taken in conjunction with the accompanying drawing, in which:

FIG. 1A-1C, illustrates a semiconductor package in accordance with an embodiment of the present invention, wherein FIG. 1A illustrates a cross-sectional view while FIGS. 1B and 1C illustrate top sectional views;

FIG. 11, which includes FIGS. 11A-11B, illustrates a semiconductor package including a heat sink in accordance with an alternative embodiment of the present invention, wherein FIG. 11A is a cross-sectional view while FIG. 11B is a top view;

FIG. 12, which includes FIGS. 12A-12B, illustrates a semiconductor package including an embedded heatsink in accordance with an alternative embodiment of the present invention, wherein FIG. 12A is a cross-sectional view while FIG. 12B is a top view of the semiconductor package;

FIG. 14, which includes

FIG. 18, which includes

FIG. 20, which includes FIG. 21, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
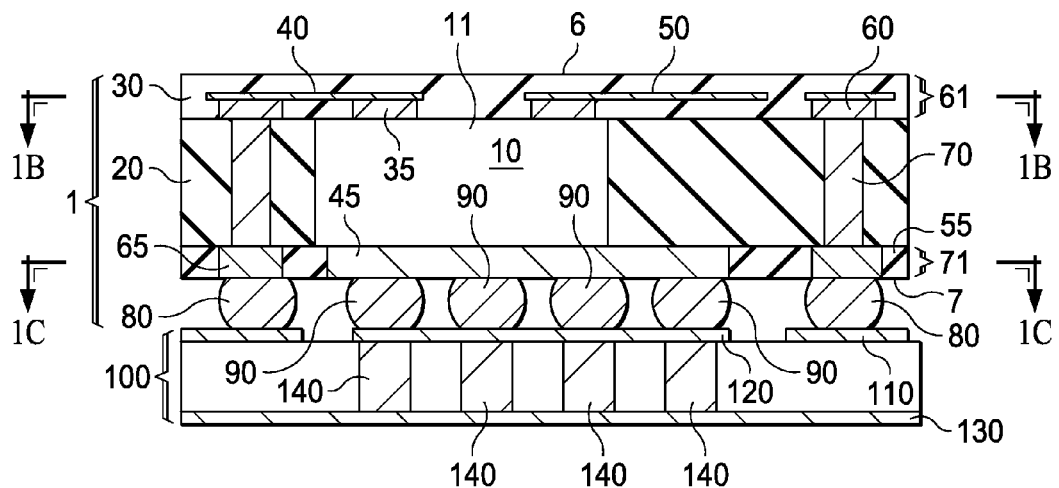

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Conventional antennas integrated within a semiconductor package have many problems. In conventional antenna designs, the antenna is integrated in the fan-out area of semiconductor package. In such conventional antenna designs, a reflector is placed at the top surface of the printed circuit board below the antenna. Consequently, critical parameters of an antenna such as impedance matching, bandwidth, directional characteristic etc. strongly depend on the distance between the antenna and the printed circuit board (PCB). However, this distance is determined during the mounting of the semiconductor package and is not a tightly controlled process resulting in large variations in the electrical parameters of the antenna. In particular, this distance depends on the size of the solder balls, solder paste, reflow processing attaching the semiconductor package with the PCB.

Moreover, the distance or spacing between the antenna and the reflector should not exceed $\lambda/4$, where $\lambda$ denotes the free-space wavelength, to ensure maximum radiation in the direction perpendicular to the PCB and to avoid any multiple maxima of radiation (so-called grating lobes). For example, when the height of solder balls is about 200 µm, this corresponds to an acceptable spacing of $\lambda/20$ at 80 GHz and $\lambda/15$ at 100 GHz. However, the bandwidth of the antenna inversely depends on the distance. The distance of 200 µm between the antenna and the reflector on the PCB is not optimal because it limits the bandwidth available for the antenna. Larger distances are advantageous for wideband applications and to reduce the sensitivity to assembly tolerances. Therefore, the use of solder balls to define the spacing limits the bandwidth of the antenna.

Further, due to the placement of the reflector within the printed circuit board, valuable real estate on the PCB is lost, which could otherwise be used for routing functions. Further, such a design restricts or limits the use of underfill materials between the semiconductor package and the printed circuit board. Further, solder balls are placed on the semiconductor chip to improve thermal management of the chip. However, the solder balls consume a large area of the chip surface, which cannot be used for other contacts.

In various embodiments, embodiments of the present invention overcome these and other problems by forming the reflector as a thin film layer on one side of the semiconductor package while forming the antenna as another thin film layer on an opposite side of the semiconductor package. Thus, advantageously, the thickness of the semiconductor package determines the spacing between the antenna and the reflector unlike conventional designs. The thickness of the semiconductor package may be controlled within the higher process tolerances than conventional solder formation processes. The opposite sides of the semiconductor package may be interconnected using through vias formed within the semiconductor package.

A structural embodiment of the present invention will be described using FIG. 1. Further structural embodiments of the present invention will be described using FIGS. 2-13 and again in FIGS. 15-20. Methods of fabricating the semiconductor package will be described using FIGS. 14 and 21.

Figure 1B:
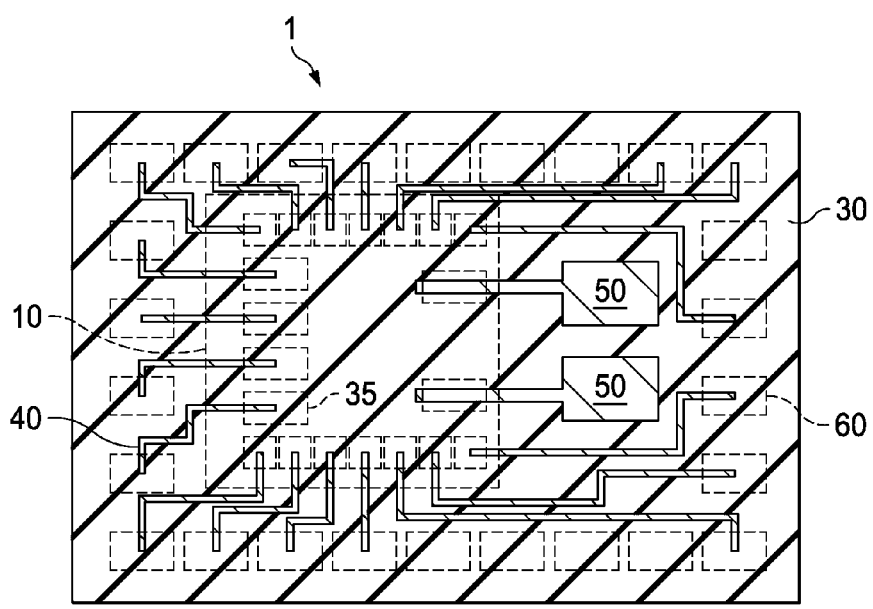
Figure 1C:
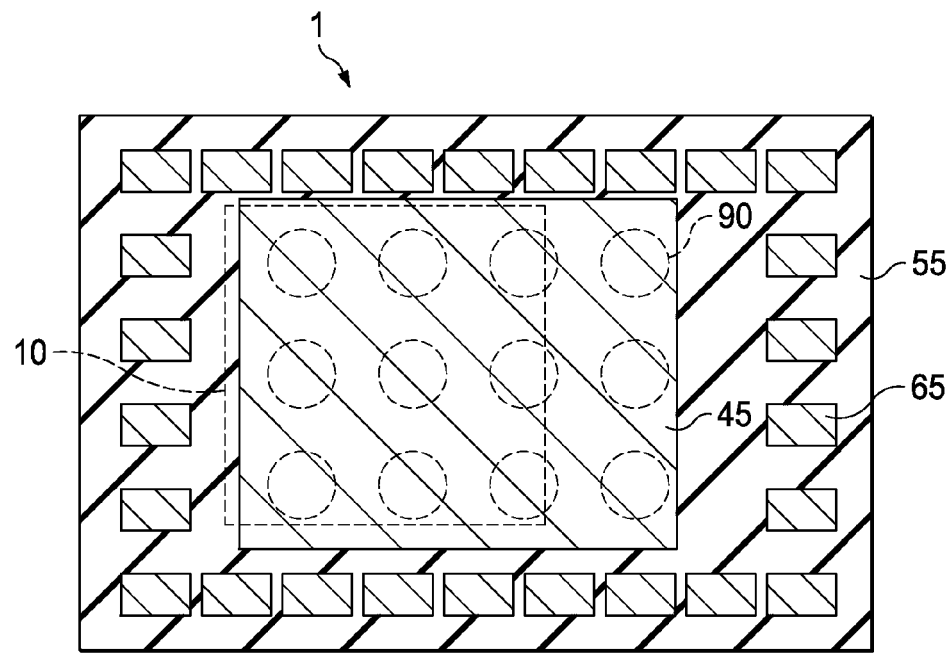
Figure 14A:
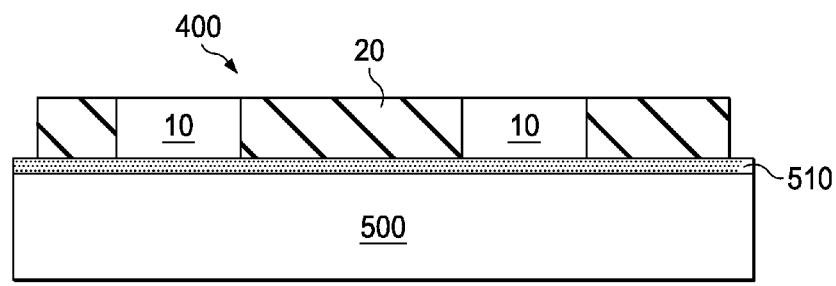
FIG. 14A-14F, illustrates a semiconductor package during various stages of fabrication in accordance with an embodiment of the present invention.
Figures 1, 14B:
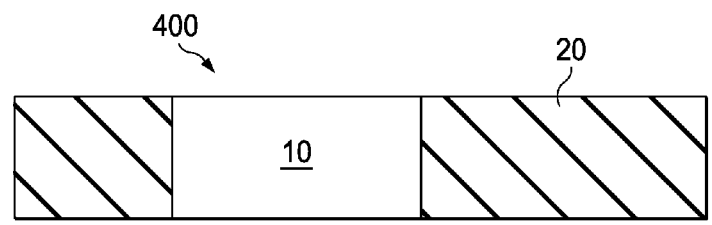
FIG. 1, which includes
Figures 2, 14B:
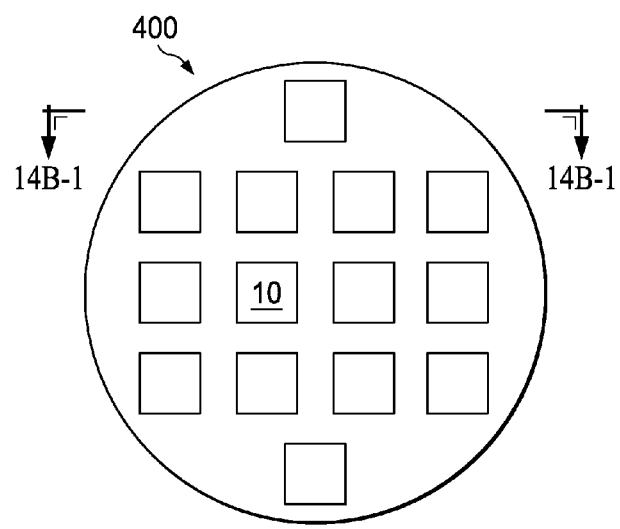

FIG. 1, which includes FIG. 1A-1C, illustrates a semiconductor package in accordance with an embodiment of the present invention. FIG. 1A illustrates a cross-sectional view while FIGS. 1B and 1C illustrate top sectional views.

Referring to FIG. 1A, a semiconductor package 1 is mounted over a printed circuit board 100. In various embodiments, the semiconductor package 1 comprises at least one semiconductor chip 10 embedded within an encapsulant 20.

The semiconductor chip 10 may comprise any type of circuitry in one or more embodiments. In one or more embodiments, the semiconductor chip 10 comprises an integrated circuit chip for wireless communication. In one or more embodiments, the semiconductor chip 10 comprises outputs and/or inputs for an antenna structure for wireless communication. The semiconductor chip 10 may be a silicon chip in one or more embodiments. In various embodiments the semiconductor chip 10 may be a monolithic microwave integrated circuit (MMIC) chip for microwave engineering processes. MMIC chips may perform functions such as microwave mixing, power amplification, low noise amplification, and high-frequency switching. MMIC chips may be mass-produced and are dimensionally small, for example, from around 1 mm² to about 10 mm², which enables the operation of high-frequency devices such as smart phones and cell phones, radar applications, for example.

In one or more embodiments, the semiconductor package 1 comprises an integrated antenna structure 50 coupled to the semiconductor chip 10. In various embodiments, the antenna structure 50 may be configured for transmitting/receiving communication signals to the semiconductor chip 10. In one or more embodiments, the antenna structure 50 may be configured to transmit or receive millimeter wave signals.

In one or more embodiments, the semiconductor package 1 may comprise a wafer level package, for example, and embedded wafer level package. In one or more embodiments, the wafer level package may be an embedded wafer level ball grid array package. In one or more embodiments the semiconductor package 1 may comprise a "chip in laminate-package". As illustrated, the semiconductor chip 10 is embedded within the encapsulant 20, which isolates the semiconductor chip 10 from other devices while simultaneously protecting the semiconductor chip 10.

The semiconductor chip 10 includes circuitry, which includes active devices, such as transistors, diodes, thyristors, and others, formed on a first major surface. As illustrated, the active devices 11 are formed adjacent the top surface of the semiconductor chip 10. In contrast, the bottom surface of the semiconductor chip 10 may not have any active devices. Therefore, the top surface of the semiconductor chip 10 includes a plurality of contact pads 35 for connecting to the devices within the semiconductor chip 10.

In various embodiments, the semiconductor package 1 comprises a fan-out package. Embedded wafer level packaging is an enhancement of the standard wafer level packaging in which the packaging is realized on an artificial wafer. In a fan-out type package at least some of the external contact pads and/or conductor lines connecting the semiconductor chip 10 to the external contact pads are located laterally outside of the outline of the semiconductor chip 10 or at least intersect the outline of the semiconductor chip 10. Thus, in fan-out type packages, a peripherally outer part of the package of the semiconductor chip 10 is typically (additionally) used for electrically bonding the package to external applications, such as application boards, etc. This outer part of the package encompassing the semiconductor chip 10 effectively enlarges the contact area of the package in relation to the footprint of the semiconductor chip 10, thus leading to relaxed constraints in view of package pad size and pitch with regard to later processing, e.g., second level assembly.

In various embodiments, the semiconductor package 1 includes a front side redistribution layer 61 at a front side 6 and a back side redistribution layer 71 at a back side 7. The front side redistribution layer 61 includes a front side insulating layer 30 comprising front side redistribution lines 40, a plurality of via pads 60, and at least one antenna structure 50.

Thus, the transmission lines available in the front side redistribution layer 61 provide low-loss interconnections between the semiconductor chip 10 and the antenna structure 50. It is obvious to a person having skill in the art that front side may carry additional devices mounted onto pads of the front side redistribution layer 61 in a certain distance to the antenna structure (not depicted). The front side redistribution layer 61, and the back side redistribution layer 71 may comprise of more than one metal layers Similarly, the back side redistribution layer 71 includes a back side insulating layer 55 comprising redistribution lines, a plurality of external contacts 65, and a reflector 45. The reflector 45 improves the directionality of the antenna such that the antenna transmits primarily in a direction perpendicular to the main surface of the semiconductor package 1. In the absence of the reflector 45, a considerable part of the energy transmitted from the antenna will be directed into the underlying printed circuit board.

In various embodiments, the semiconductor package 1 comprises the plurality of external contacts 65 at the back side 7 of the semiconductor package 1. The back side 7 of the semiconductor package 1 is opposite to the front side 6 of the semiconductor package 1, which is adjacent the top surface of the semiconductor chip 10 while the back side 7 of the semiconductor package 1 is adjacent the bottom surface of the semiconductor chip 10.

The plurality of contact pads 35 on the top surface of the semiconductor chip 10 are coupled to the plurality of external contacts 65 at the back side 7 of the semiconductor package 1. In various embodiments, the plurality of contact pads 35 on the top surface of the semiconductor chip 10 are coupled to the plurality of external contacts 65 by front side redistribution lines 40 and through encapsulant vias 70. The front side redistribution lines 40 are formed over the top surface of the semiconductor chip 10 and couple the plurality of contact pads 35 to a plurality of via pads 60 (see also FIG. 1B). The plurality of via pads 60 are coupled to the plurality of external contacts 65 using the through encapsulant vias 70.

Referring to FIG. 1B, some of the plurality of contact pads 35 on the top surface of the semiconductor chip 10 are coupled to a plurality of antenna structures 50. In FIG. 1B, two antenna structures 50 are illustrated while in various embodiments less or more number of antenna structures may be used. The plurality of contact pads 35 are used for external power/ground and low-frequency signal contacts and also provide mechanical support.

In various embodiments, the integrated antenna structure 50 may comprise any type of antenna such as planar antennas. FIG. 1B illustrates a patch antenna in accordance with an embodiment. In an alternative embodiment, the antenna structure 50 may comprise a whip antenna (straight metal line). In one embodiment, the antenna structure 50 comprises a patch of metal formed within a redistribution layer of the semiconductor package 1. The reflector 45 at the back side 7 is larger than the patch of metal forming the antenna structure 50 and is grounded.

Referring to FIG. 1C, the plurality of external contacts 65 are arranged at the back side 7 of the semiconductor package 1. Additionally, a reflector 45 is disposed at the back side 7 of the semiconductor package 1. In various embodiments, the reflector 45 overlaps the antenna structure 50 at the front side 6.

In one or more embodiments, the reflector 45 is larger than the patch of metal forming the antenna structure 50 so as to produce stable patterns and lower environmental sensitivity. In one or more embodiments, the reflector 45 is at least 1.5× the size of the antenna structure 50. In one or more embodiments, the reflector 45 is at least 2× the size of the antenna structure 50. In one or more embodiments, the reflector 45 is at least 5× the size of the antenna structure 50. In one or more embodiments, the reflector 45 is about 1.1× to about 10× the size of the antenna structure 50. In one or more embodiments, the reflector 45 is about 1.5× to about 5× the size of the antenna structure 50. However, in some embodiments, the reflector 45 may be about the same size or only slightly (~1.05×) larger than the patch of the antenna structure 50.

As illustrated in FIGS. 1A and 1C, a plurality of contact solder balls 80 is disposed under the plurality of external contacts 65 and extend out of the semiconductor package 1. The plurality of contact solder balls 80 is coupled between the plurality of external contacts 65 and the PCB contact pads 110 at the top surface of the printed circuit board 100.

Similarly, a plurality of thermal solder balls 90 is disposed under the chip backside and/or under the reflector 45. The plurality of thermal solder balls 90 are bonded to the thermal contact pads 120 at the top surface of the printed circuit board 100. The plurality of thermal solder balls 90 are optional and may not be used in some embodiments.

The printed circuit board 100 includes the PCB contact pad 110 and the thermal contact pads 120 at the top surface. The printed circuit board 100 includes the back side heat sink 130 at the back surface. The thermal contact pads 120 are coupled to the back side heatsink 130 by through vias 140. The printed circuit board 100 may comprise other circuitry, e.g., metal lines and vias for connecting the semiconductor package 1 with other components on the printed circuit board 100. The front side redistribution layer 61 of the semiconductor package 1 may carry additional devices mounted onto pads of the front side redistribution layer 61 in a certain distance to the antenna structure (not depicted). The front side redistribution layer 61 and the back side redistribution layer 71 may comprise of more than one metal layers in various embodiments. In various embodiments, more than one chip and/or passives might be embedded in the semiconductor package 1.

Advantageously, embodiments of the invention overcome many of the limitations of conventional antenna design. For example, the distance between the antenna and reflector is set by the package thickness and is insensitive to assembly tolerances. The increased distance, e.g., greater than 200 μm, between the antenna and the reflector makes it possible to realize antennas of wider bandwidths. Further, the thickness of the semiconductor package 1 may be changed to satisfy different antenna requirements and thus different millimeter-wave applications. Thus embodiments of the present invention enable forming stable antennas with better electrical properties. Further, there are no restrictions on the routing within the PCB unlike conventional antenna designs because the reflector is not formed within the PCB but rather integrated within the semiconductor package 1.

As an additional advantage, the entire area underneath the semiconductor chip 10 may be used for thermal solder balls 90 without influencing the on-chip circuitry which is now placed on the opposite side of the silicon chip. This leads to better heat dissipation and enables scaling the semiconductor chip 10 to smaller dimensions without compromising thermal management.

Figure 2:
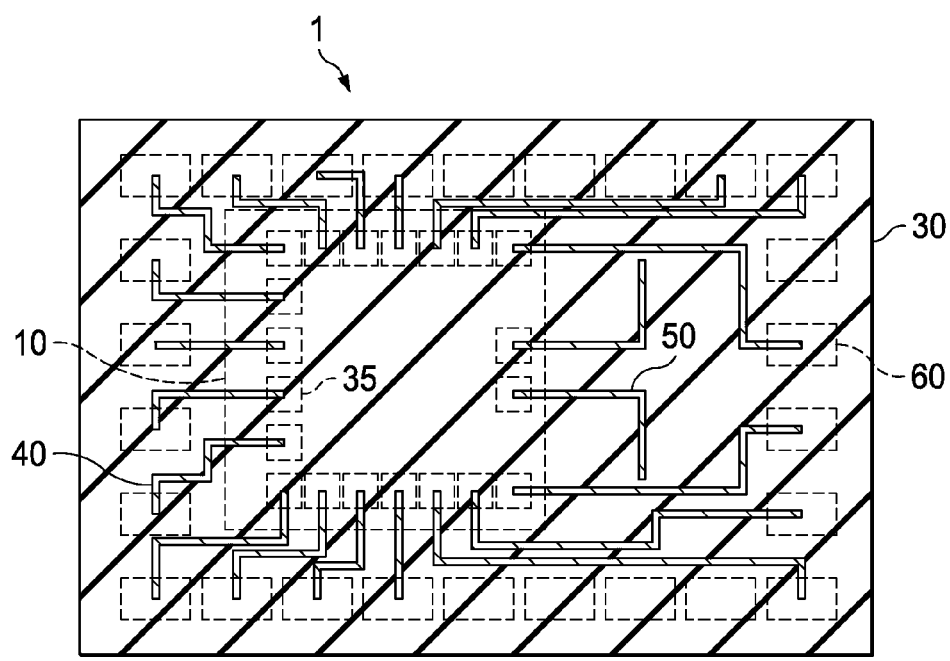
FIG. 2 illustrates a top sectional view of a semiconductor package illustrating a dipole antenna in accordance with an alternative embodiment of the present invention.

FIG. 2 illustrates a top sectional view of a semiconductor package in accordance with an alternative embodiment of the present invention. The top sectional view of FIG. 2 may correspond to a cut line 1B-1B illustrated in FIG. 1A.

As illustrated in FIG. 2, in this embodiment the antenna structure 50 has a dipole antenna. The dipole antenna includes two metal lines oriented in parallel and in the same line with each other, with a small space separating them.

Figure 3:
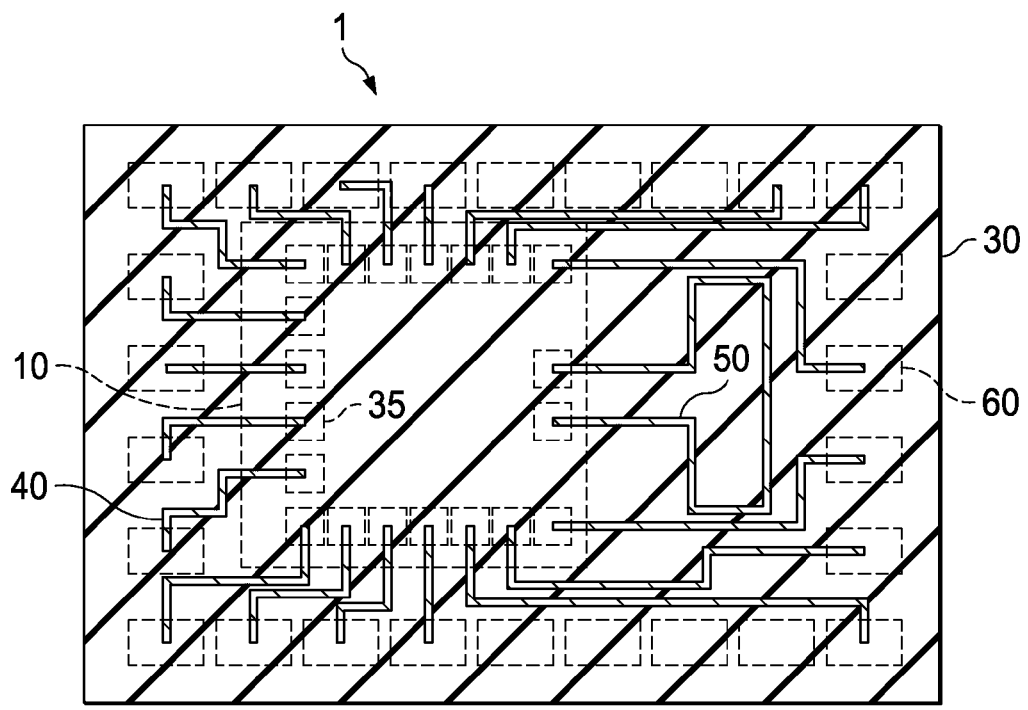
FIG. 3 illustrates a top sectional view of a semiconductor package illustrating a folded dipole antenna in accordance with an alternative embodiment of the present invention.

FIG. 3 illustrates a top sectional view of a semiconductor package in accordance with an alternative embodiment of the present invention. The top sectional view of FIG. 3 may correspond to a cut line 1B-1B illustrated in FIG. 1A.

Referring to FIG. 3, the antenna structure 50 is the folded dipole antenna. The ends of the antenna structure 50 are folded back to the center point. This antenna structure 50 may have a greater bandwidth than dipole antenna illustrated in FIG. 2.

Figure 4:
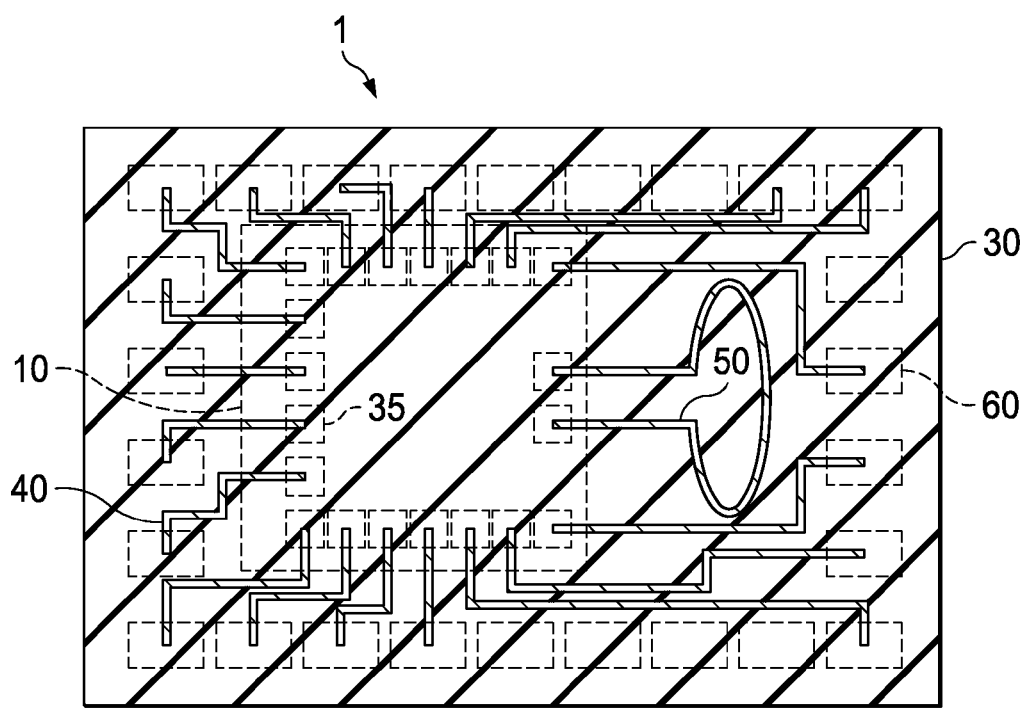
FIG. 4 illustrates a top sectional view of a semiconductor package illustrating a ring antenna in accordance with an alternative embodiment of the present invention.

FIG. 4 illustrates a top sectional view of a semiconductor package in accordance with an alternative embodiment of the present invention. The top sectional view of FIG. 4 may correspond to a cut line 1B-1B illustrated in FIG. 1A.

As next illustrated in FIG. 4, in this embodiment, the antenna structure 50 is a ring antenna. In further embodiments, the antenna structure 50 may be a choke ring antenna.

Figure 5:
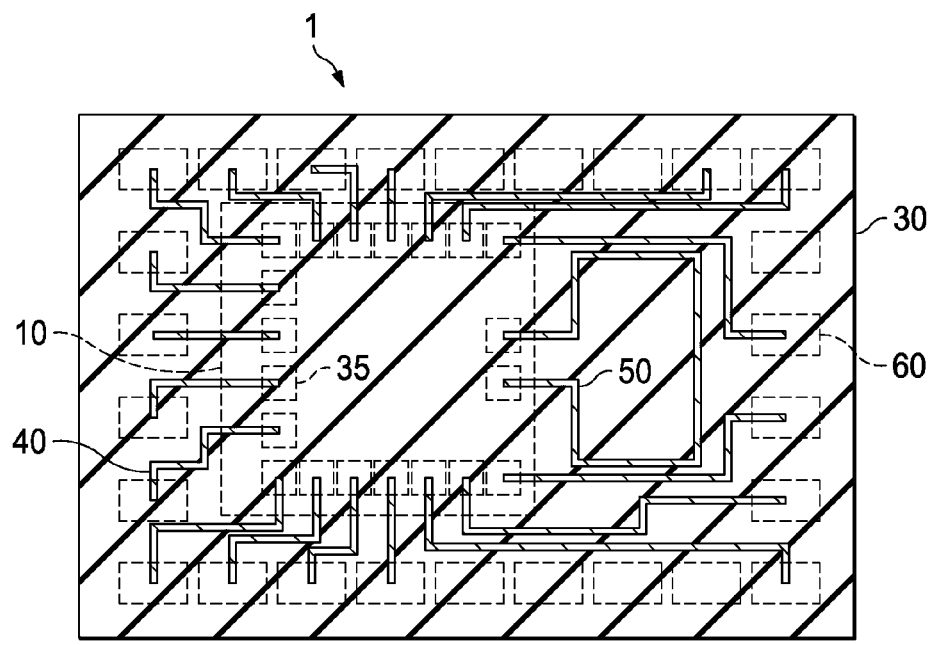
FIG. 5 illustrates a top sectional view of a semiconductor package illustrating a loop antenna in accordance with an alternative embodiment of the present invention.

FIG. 5 illustrates a top sectional view of a semiconductor package in accordance with an alternative embodiment of the present invention. The top sectional view of FIG. 5 may correspond to a cut line 1B-1B illustrated in FIG. 1A.

As further illustrated in FIG. 5, in an alternative embodiment, the antenna structure 50 is the rectangular loop antenna.

Figure 6:
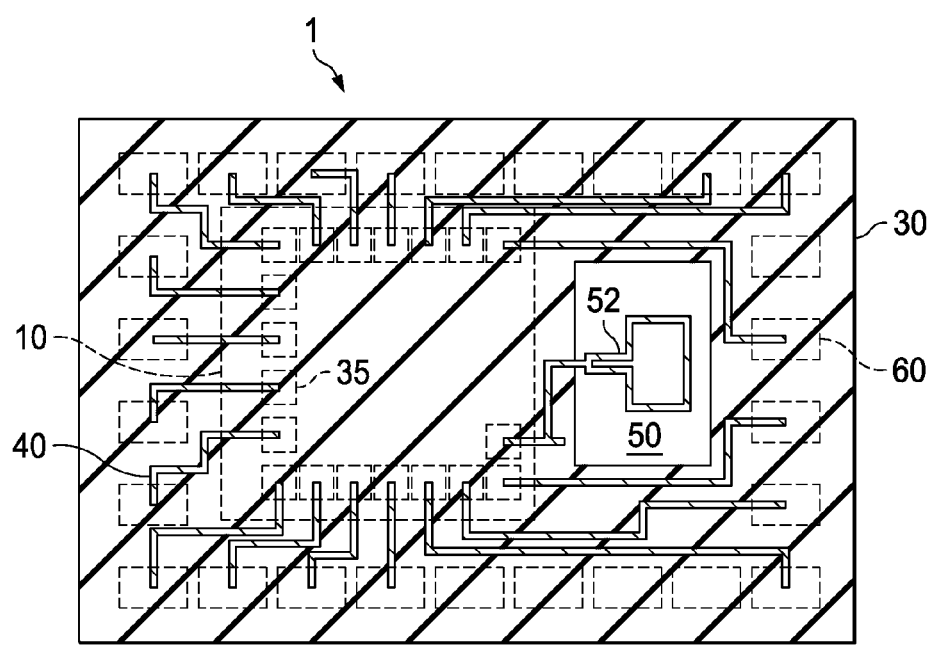
FIG. 6 illustrates a top sectional view of a semiconductor package illustrating a coplanar patch antenna in accordance with an alternative embodiment of the present invention.

FIG. 6 illustrates a top sectional view of a semiconductor package in accordance with an alternative embodiment of the present invention. The top sectional view of FIG. 6 may correspond to a cut line 1B-1B illustrated in FIG. 1A.

As further illustrated in FIG. 6, in an alternative embodiment, the antenna structure 50 may be a coplanar patch antenna.

Figure 7:
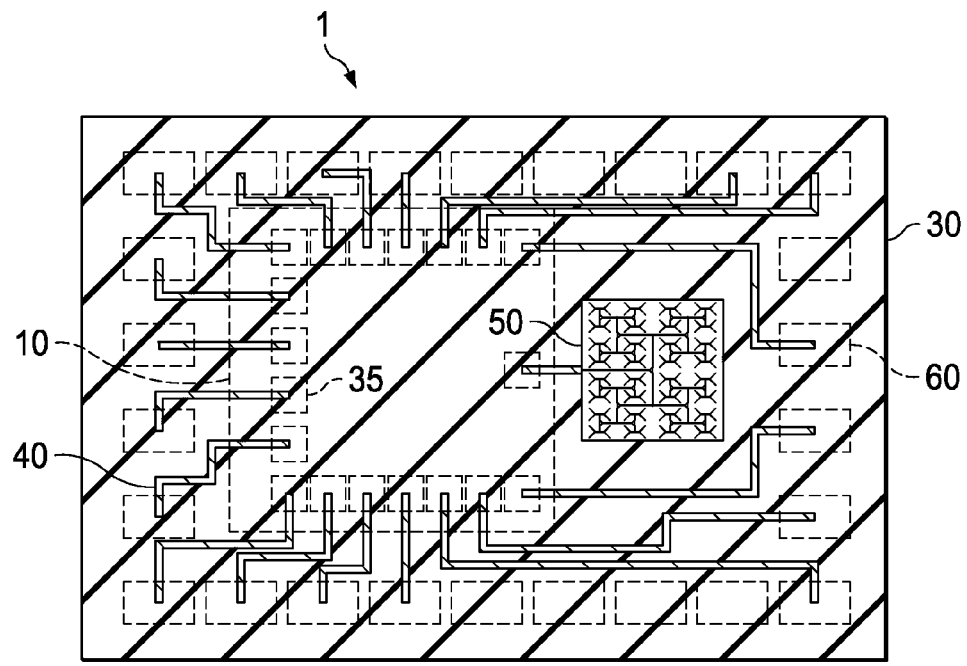
FIG. 7 illustrates a top sectional view of a semiconductor package illustrating an antenna array in accordance with an alternative embodiment of the present invention.

FIG. 7 illustrates a top sectional view of a semiconductor package in accordance with an alternative embodiment of the present invention. The top sectional view of FIG. 7 may correspond to a cut line 1B-1B illustrated in FIG. 1A.

In various embodiments, the antenna structure 50 may comprise an antenna array. The antenna array may be formed in any suitable pattern or array of structures (described above) in various embodiments. In various embodiments, the antenna elements of the antenna array may be arranged to form a 1 or 2 dimensional pattern. In various embodiments, the antenna structure 50 may comprise other antenna structures including other slot antennas, monopole antennas, and others.

Figure 8:
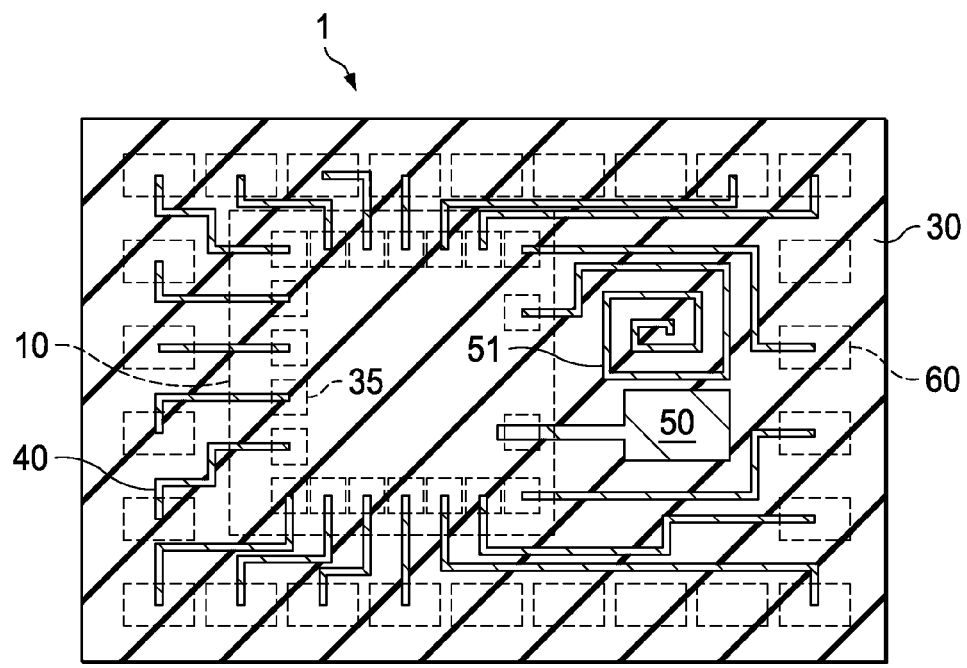
FIG. 8 illustrates a top sectional view of a semiconductor package including a passive device in accordance with an alternative embodiment of the present invention.

FIG. 8 illustrates a top sectional view of a semiconductor package including a passive device in accordance with an alternative embodiment of the present invention.

In various embodiments, the semiconductor package 1 may include a passive device 51 such as an inductor, a resistor, a capacitor disposed within the encapsulant 20 (e.g., FIG. 1) and/or the front side redistribution layer 61. For example, the passive device 51 may include a coil disposed in the front side redistribution layer 61 proximate the antenna structure 50 in one embodiment.

Figure 9:
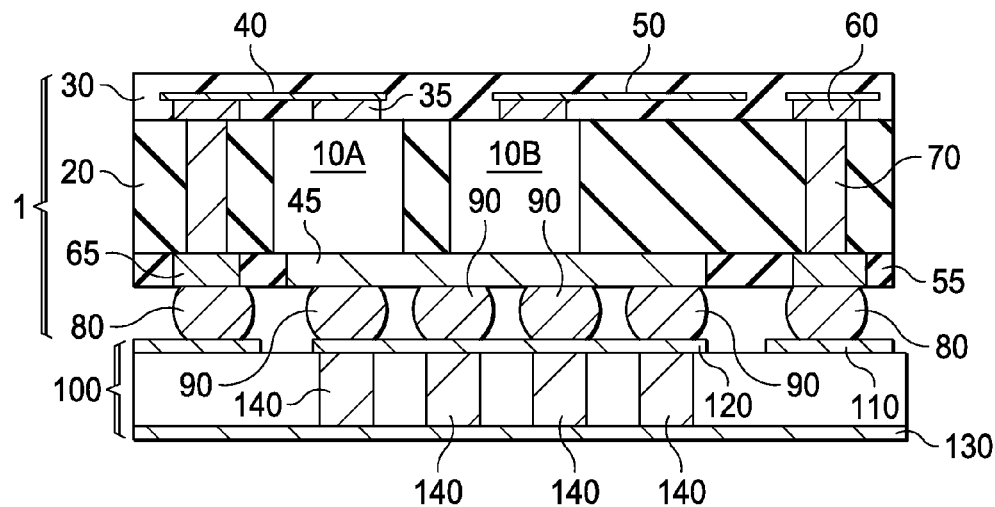
FIG. 9 illustrates a cross-sectional view of a semiconductor package including a multiple semiconductor chips in accordance with an alternative embodiment of the present invention.

FIG. 9 illustrates a cross-sectional view of a semiconductor package including a multiple semiconductor chips in accordance with an alternative embodiment of the present invention.

Referring to FIG. 9, in one or more embodiments, the semiconductor package 1 may comprise more than one semiconductor chip. As illustrated, a first semiconductor chip 10A and a second semiconductor chip 10B may be formed within the encapsulant 20. In one or more embodiments, at least one of the semiconductor chip is coupled to the antenna structure 50. In some embodiments, both the first semiconductor chip 10A and the second semiconductor chip 10B may be coupled to an antenna structure 50.

Figure 10:
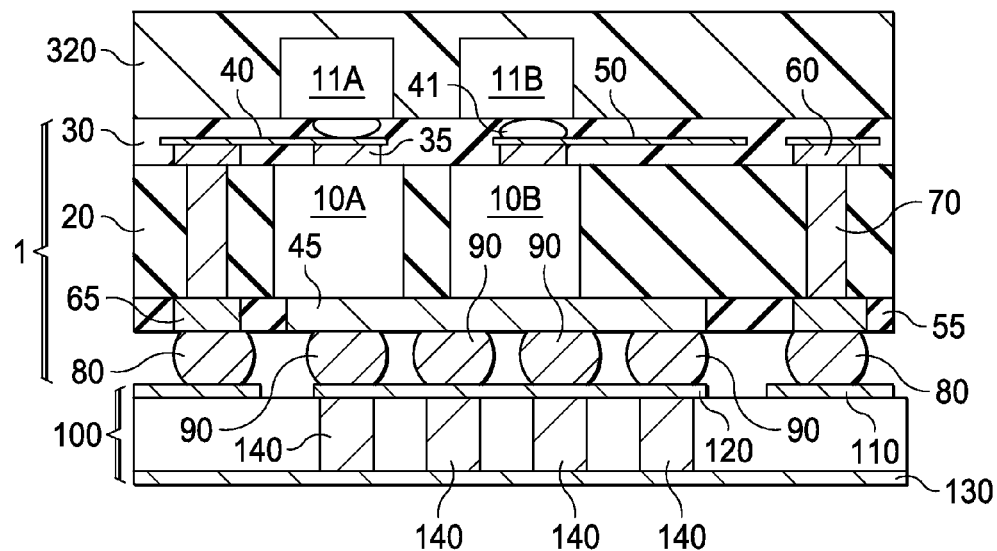
FIG. 10 illustrates a cross-sectional view of a semiconductor package including multiple stacked semiconductor chips in accordance with an alternative embodiment of the present invention.

FIG. 10 illustrates a cross-sectional view of a semiconductor package including multiple stacked semiconductor chips in accordance with an alternative embodiment of the present invention.

Unlike the prior embodiment, this embodiment may further include stacked semiconductor chips disposed over the first and the second semiconductor chips 10A and 10B. As illustrated, a third semiconductor chip 11A may be disposed over the first semiconductor chip 10A and the fourth semiconductor chip 11B may be disposed over the second semiconductor chip 10B. The third semiconductor chip 11A and the fourth semiconductor chip 11B may comprise integrated circuits or discrete chips or passives in various embodiments. The third semiconductor chip 11A and the fourth semiconductor chip 11B may be encapsulated by a second encapsulant 320. The third semiconductor chip 11A and the fourth semiconductor chip 11B may be mounted facedown (e.g., the active region of the third semiconductor chip 11A facing the active region of the first semiconductor chip 10A). The third semiconductor chip 11A and the fourth semiconductor chip 11B may be coupled to the plurality of external contacts 65 through the through encapsulant vias 70. Alternatively, the third semiconductor chip 11A and the fourth semiconductor chip 11B may be mounted face up and bonded to the plurality of via pads 60 through bond wires.

Figure 11A:
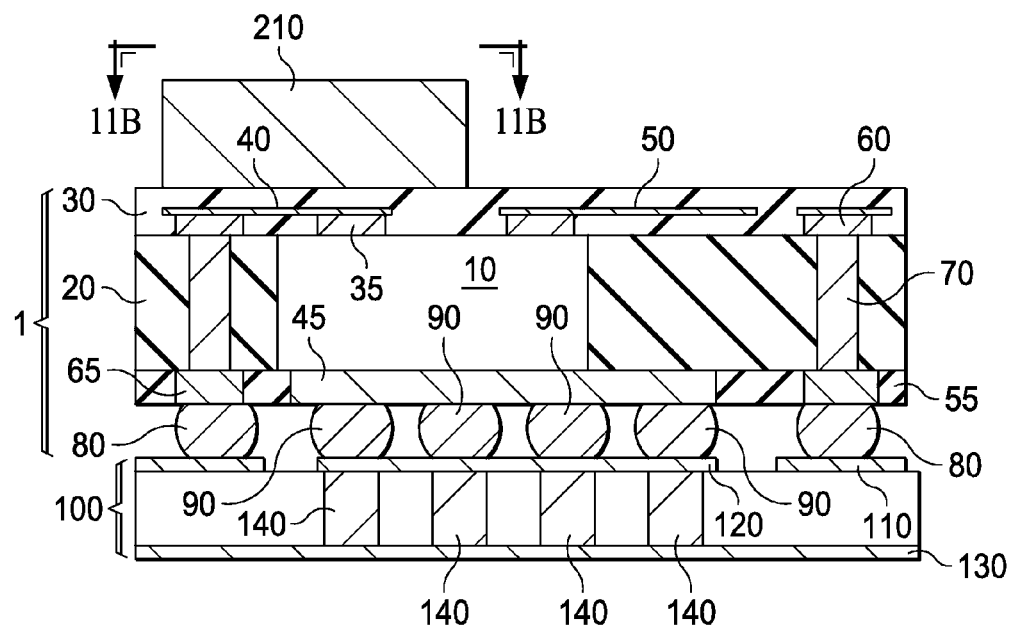
Figure 11B:
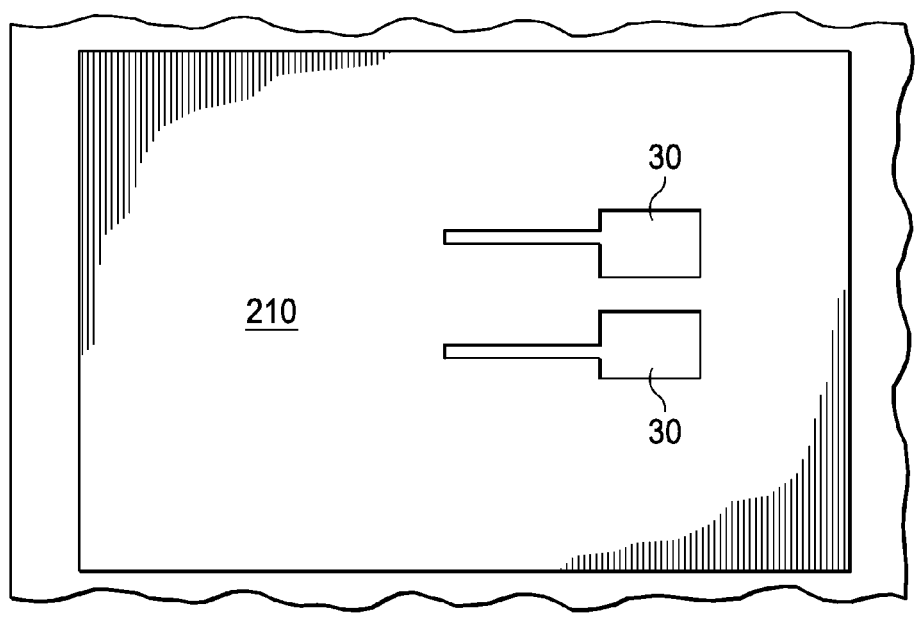

FIG. 11, which includes FIGS. 11A-11B, illustrates a semiconductor package including a heat sink in accordance with an alternative embodiment of the present invention. FIG. 11A is a cross-sectional view while FIG. 11B is a top view.

In various embodiments, as illustrated in FIG. 11A, a heatsink 210 may be mounted over the semiconductor package 1 to efficiently remove heat generated within the semiconductor chip 10. The heatsink 210 is attached such that the antenna structure 50 is not blocked. For example, a heatsink 210 may have slots for the antenna structure 50 (FIG. 11B). In one or more embodiments, the slots are larger than the antenna structure 50 to avoid shadowing effects. The slots may have slopes or might 3-dimensionally shaped in various embodiments.

Figure 12A:
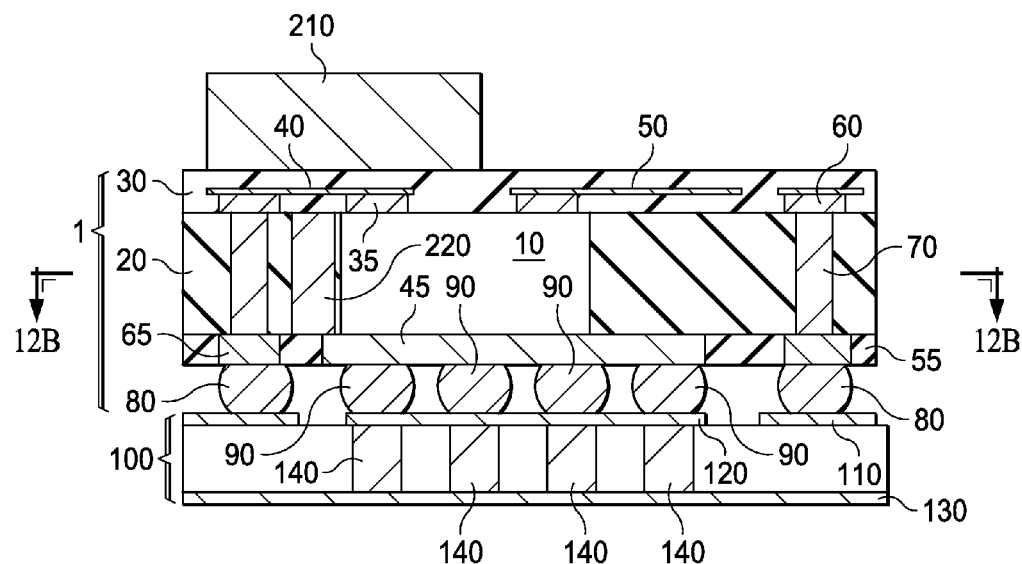
Figure 12B:
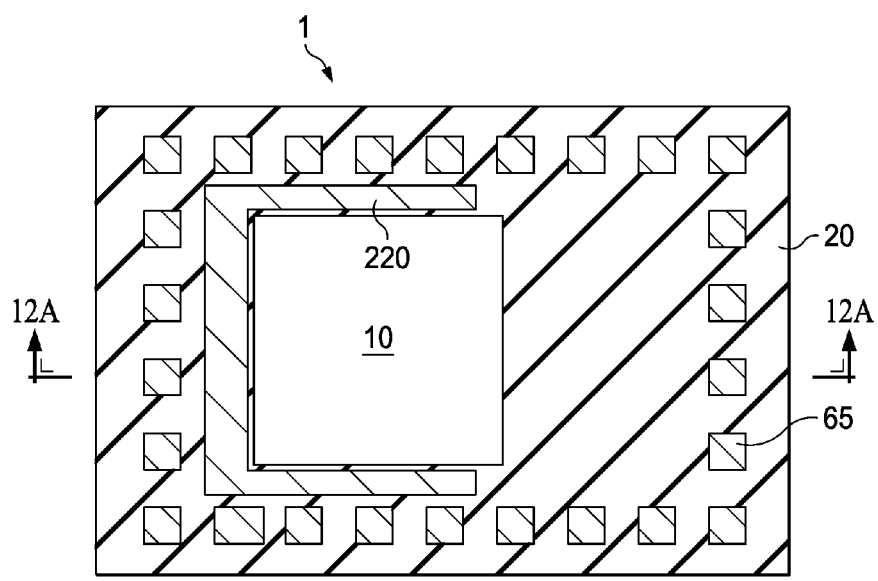

FIG. 12, which includes FIGS. 12A-12B, illustrates a semiconductor package including an embedded heatsink in accordance with an alternative embodiment of the present invention. FIG. 12A is a cross-sectional view while FIG. 12B is a top view of the semiconductor package.

In this embodiment, in addition to the heatsink 210 described with respect to FIG. 11, an embedded heatsink 220 is disposed within the encapsulant 20. The embedded heatsink 220 may comprise a semiconductor material such as silicon or may comprise metallic material in various embodiments. In various embodiments, the embedded heatsink 220 may comprise a via or other structures. In one embodiment, the embedded heatsink 220 is formed as a trench surrounding one or more sidewalls of the semiconductor chip 10 (see also FIG. 12B). In various embodiments, the embedded heatsink 220 is not formed under the antenna structure 50 to prevent interference to the operation of the antenna. In various embodiments, the embedded heatsink 220 is designed as ground or power connection from top to bottom side. In various embodiments, the heatsink 220 is designed as multilayer metal sheets to provide ground and power connection from top to bottom side.

Figure 13:
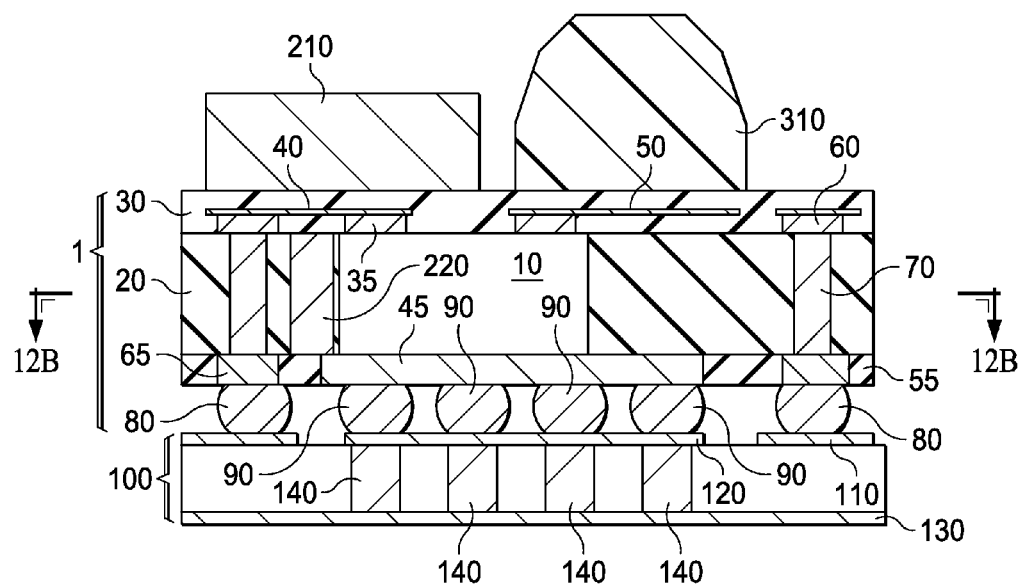
FIG. 13 illustrates a semiconductor package including a dielectric lens disposed over the antenna structure in accordance with an alternative embodiment of the present invention.

FIG. 13 illustrates a semiconductor package including a dielectric lens mounted over the antenna structure in accordance with an alternative embodiment of the present invention.

Referring to FIG. 13, a dielectric lens 310 may be disposed over the antenna structure 50 and over the front side of the semiconductor package 1. The base of the dielectric lens 310 may be aligned to be parallel to the antenna structure 50. The sidewalls of the dielectric lens 310 may be configured to improve the directionality of the antenna structure 50. In various embodiments, the dielectric lens 310 may have a pyramid shape, a cone, a truncated pyramid/cone shape structure or a rotational symmetric parabolic/higher order shape structure.

FIG. 14, which includes FIG. 14A-14F, illustrates a semiconductor package during various stages of fabrication in accordance with an embodiment of the present invention.

Referring to FIG. 14A, the reconstituted wafer 400 comprising a semiconductor chip 10 is formed. Referring to FIG. 14A, a plurality of semiconductor chips 10 are placed over a carrier 500. The plurality of semiconductor chips 10 may be formed using conventional processing, for example, within a wafer, which is diced to form the plurality of semiconductor chips 10. As described above, the plurality of semiconductor chips 10 may be formed on a silicon substrate such as a bulk silicon substrate or a silicon on insulator (SOI) substrate. Alternatively, the semiconductor chip 10 may be a device formed on silicon carbide (SiC) or gallium arsenide (GaAs). Embodiments of the invention may also include devices formed on compound semiconductor substrates and may include devices on hetero-epitaxial substrates. In one embodiment, the semiconductor chip 10 is a device formed at least partially on gallium nitride (GaN), which may be a GaN on sapphire or silicon substrate.

Next, the plurality of semiconductor chips 10 is attached to the carrier 500 using an adhesive layer 510. The carrier 500 provides mechanical support and stability during processing. In various embodiments, the carrier 500 may be an adhesive tape, a frame, a plate made of a rigid material, for example, a metal such as nickel, steel, or stainless steel, a laminate, a film, or a material stack.

An encapsulant 20 is applied over the plurality of semiconductor chips 10 and encloses at least partially the plurality of semiconductor chips 10. In one embodiment, the encapsulant 20 is applied using a molding process such as compression molding, transfer molding process, injection molding, granulate molding, powder molding, liquid molding, as well as printing processes such as stencil or screen printing.

In various embodiments, the encapsulant 20 comprises a dielectric material and may comprise a mold compound in one embodiment. In other embodiments, the encapsulant 20 may comprise one or more of a polymer, a copolymer, a biopolymer, a fiber impregnated polymer (e.g., carbon or glass fibers in a resin), a particle filled polymer, and other organic materials. In one or more embodiments, the encapsulant 20 comprises a sealant not formed using a mold compound, and materials such as epoxy resins and/or silicones. In various embodiments, the encapsulant 20 may be made of any appropriate duroplastic, thermoplastic, a thermosetting material, or a laminate. The material of the encapsulant 20 may include filler materials in some embodiments. In one embodiment, the encapsulant 20 may comprise epoxy material and a fill material comprising small particles of glass or other electrically insulating mineral filler materials like alumina or organic fill materials. The encapsulant 20 may be cured, i.e., subjected to a thermal process to harden thus forming a hermetic seal protecting the plurality of semiconductor chips 10. The curing process hardens the encapsulant 20 thereby forming a single substrate holding the plurality of semiconductor chips 10. Such a substrate is referred as a reconstituted wafer 400. The form of the substrate is not limited to a wafer and can be a panel like in various embodiments.

In one or more embodiments, the thickness of the reconstituted wafer 400 may be configured to improve impedance matching and bandwidth of the antenna. The spacing between the antenna structure 50 and the reflector 45 being formed in subsequent steps may be controlled by the thickness of the reconstituted wafer 400. In various embodiments, the thickness of the reconstituted wafer may vary from about 20 µm up to about 2000 µm.

FIG. 14B, which includes FIGS. 14B-1 and 14B-2, illustrates the semiconductor package, during fabrication, after separating the reconstituted wafer from the carrier in accordance with an embodiment of the invention.

Referring to FIG. 14B, the carrier 500 is removed to separate the reconstituted wafer 400 or artificial wafer. The encapsulant 20 provides mechanical and thermal stability during subsequent processing. During subsequent processing, the reconstituted wafer 400 may be subjected to temperatures as high as 300° C. depending on the thermal stability of the encapsulant 20 in various embodiments.

Figure 14C:
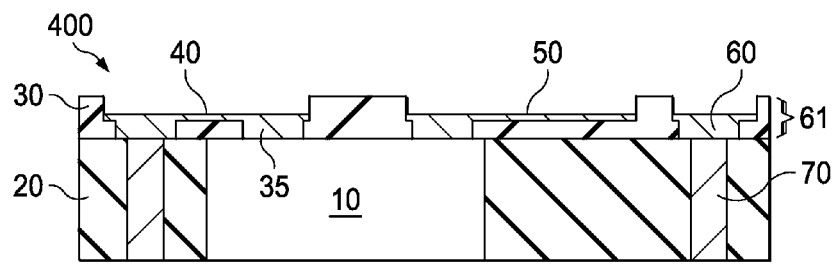

In one embodiment after forming the reconstituted wafer 400, as illustrated in FIG. 14C, through encapsulant vias 70 are formed within the encapsulant 20. The through encapsulant vias 70 may be formed by forming openings in the encapsulant 20 and filling the openings with a conductive material. Alternatively, in some embodiments, the through encapsulant vias 70 may be formed during the formation of the reconstituted wafer 400. For example, in one or more embodiments, via bars e.g. silicon bars, PCB bar or/and metal bars may be placed along with the semiconductor chip 10 before forming the encapsulant 20. In various embodiments, the dimensions of the through encapsulant vias 70 varies in diameter and/or shape from about 15 µm to about 500 µm, and the depth depends on the thickness of the reconstituted wafer.

In various embodiments, the through encapsulant vias 70 may be patterned either by a photo-lithography and etch combination or alternatively by a laser drilling process. As the through encapsulant vias 70 are formed embedded in a dielectric material (encapsulant 20), additional formation of dielectric spacer around the through encapsulant vias 70 is advantageously avoided.

The front side redistribution layer 61 is formed over the active side of the semiconductor chip 10. A front side insulating layer 30 is deposited over the reconstituted wafer 400. Next, front side redistribution lines 40 and the antenna structure 50 are formed within the front side insulating layer 30. The number of redistribution layers is not limited to one in various embodiments.

A front side insulating layer 30 may formed over the last metal level of the metallization of the semiconductor chip 10, which may include a plurality of contact pads 35. The front side insulating layer 30 is patterned forming redistribution lines and contact pads. In one or more embodiments, the front side insulating layer 30 may comprise an oxide layer or an oxide/nitride layer stack. In other embodiments, the front side insulating layer 30 may comprise silicon nitride, silicon oxynitride, FTEOS, SiCOH, polyimide, photoimide, BCB or other organic polymers, or combinations thereof. An optional insulating liner may be formed above the front side insulating layer 30. The optional insulating liner may comprise a nitride layer, in one embodiment. In various embodiments, the optional insulating liner may comprise FTEOS, $SiO_2$, SiCOH, or other low-k materials. Using a photolithography process, the front side insulating layer 30 is patterned to open the bond pads on the last metal level, e.g., the plurality of contact pads 35 of the semiconductor chip 10.

Front side redistribution lines 40 and the antenna structure 50 are formed in the patterned front side insulating layer 30, for example, by depositing a metal liner such as e.g. titanium, tungsten-titanium, titanium nitride or tantalum nitride, followed by a seed layer and electroplating process. In one or more embodiments, the front side redistribution lines 40 comprise copper or conductive material amenable to a plating process. In various embodiments, the front side redistribution lines 40 may comprise multiple layers, for example, Cu/Ni, Cu/Ni/Pd/Au, Cu/NiMoP/Pd/Au, or Cu/Sn, in one embodiment. In various embodiments, the front side redistribution lines 40 may be formed at the same time as the antenna structure 50.

Figure 14D:
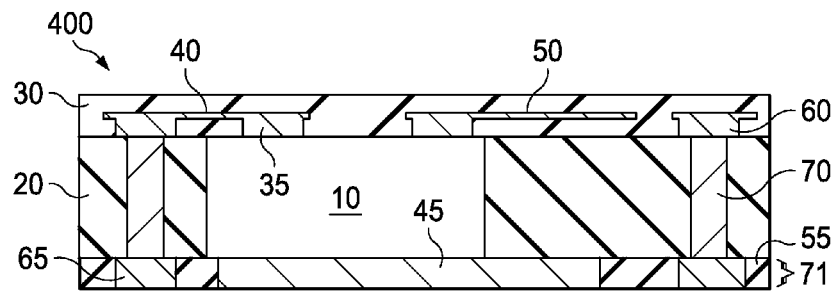

Referring next to FIG. 14D, a back side redistribution layer 71 is formed under the back side of the reconstituted wafer. The front side redistribution lines 40 may be covered with an insulating material layer during subsequent processing as illustrated in FIG. 14D. This insulation material layer might be a pattern to enable interconnecting additional devices assembled on top of the front side redistribution layer 61.

A back side insulating layer 55 is deposited under the reconstituted wafer 400. The plurality of external contacts 65 are formed within the back side insulating layer 55. A back plate, for example, a reflector 45 is formed underneath the semiconductor chip 10 so as to overlap the antenna structure 50. In various embodiments, the plurality of external contacts 65 and the reflector 45 are formed using a common electroplating process during the formation of back side redistribution lines. In various embodiments, the number of redistribution layers at the front side and the back side such as the front side redistribution layer 61 and the back side redistribution layer 71 may be more and may not be not limited to one, which is used only for illustration.

Figure 14E:
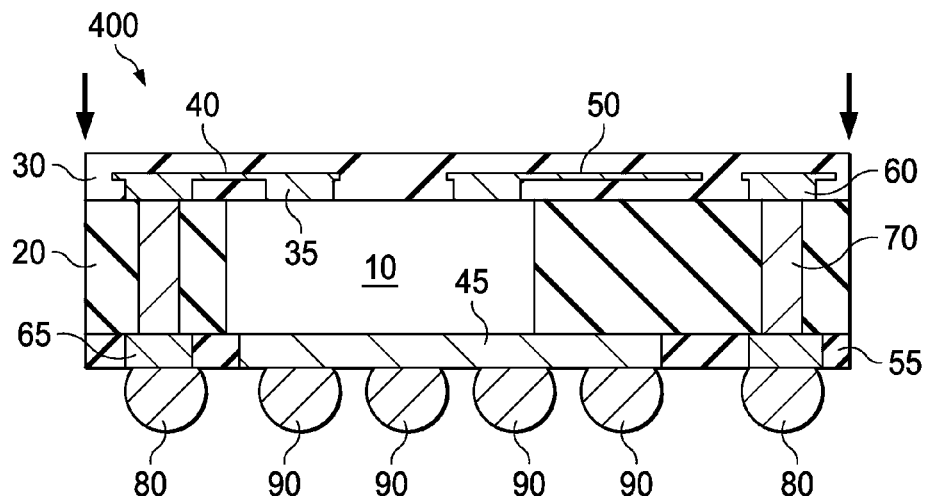

As next illustrated in FIG. 14E, solder balls are formed under the back side redistribution layer 71. A plurality of contact solder balls 80 is formed under the plurality of external contacts 65. A plurality of thermal solder balls 90 is formed under the reflector 45.

As illustrated by the arrows, the reconstituted wafer 400 is diced to form individual semiconductor packages 1. The dicing may be performed using a mechanical sawing process or a laser dicing process in one or more embodiments. The semiconductor package 1 comprises a plurality of external contacts 65 for forming external contacts. The semiconductor package 1 thus being formed may be tested prior to subsequent packaging. For example, a test probe may be applied over the plurality of external contacts 65 to identify defective units.

The semiconductor package 1 thus formed may be used directly and mounted on a circuit board in some embodiments. In other embodiments, the semiconductor package 1 may be further packaged over a lead frame, clip frame, and other suitable substrates, to form a semiconductor module. Embodiments of the invention include forming any suitable type of packages, for example, compatible with JEDEC standards. Examples include transistor outline packages, small outline packages, thin small outline packages, thin shrink small outline packages, single in line packages, BGA and others.

Figure 14F:
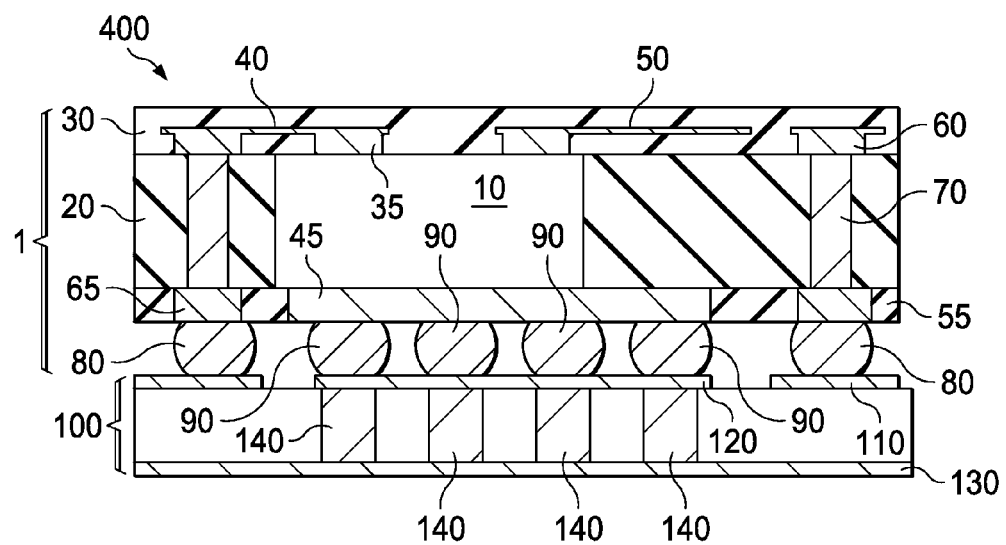

Referring to FIG. 14F, in one or more embodiments, the semiconductor package 1 is mounted onto a printed circuit board 100. The plurality of thermal solder balls 90 may be attached to thermal contact pads on the printed circuit board 100 while the plurality of contact solder balls 80 are attached to PCB contact pads 110.

Alternative structural embodiments of a semiconductor package having an integrated antenna structure will be described in accordance with an embodiment of the present invention.

Figure 15:
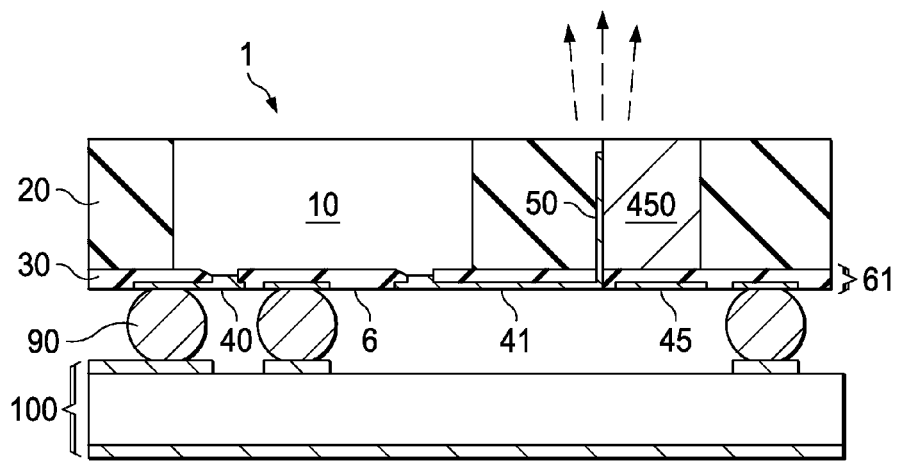
FIG. 15 describes a semiconductor package having an integrated antenna disposed in a via bar.

FIG. 15 describes a semiconductor package having an integrated antenna disposed in a via bar in accordance with an embodiment of the present invention.

Referring to FIG. 15, a semiconductor package 1 is mounted over a printed circuit board 100. In various embodiments, the semiconductor package 1 comprises a semiconductor chip 10 embedded within an encapsulant 20. In one or more embodiments, the semiconductor package 1 comprises an integrated antenna structure 50 coupled to the semiconductor chip 10.

In various embodiments, the semiconductor package 1 includes a front side redistribution layer 61 at a front side 6. The front side redistribution layer 61 includes a front side insulating layer 30 comprising front side redistribution lines 40.

At least one antenna structure 50 is disposed in a via bar 450 disposed in the encapsulant 20. The via bar 450 is a structure embedded within the encapsulant 20 and may be formed during the formation of the reconstituted wafer described above in various embodiments. As a consequence, the via bar 450 may include many different structures. In one or more embodiments, the via bar 450 may comprise a silicon bar, a PCB-via-bar or any other substrate with metallization formed therein for the antenna structure.

In various embodiments, the via bar 450 may be manufactured in a PCB-like manner. The via bar 450 may comprise a substrate material like laminate, ceramic, duroplast, encapsulant, thermoplast, or other materials in various embodiments. The structures of the via bars 450 may comprise analog PCB or thin film technologies in one or more embodiments. In various embodiments, the via bars 450 are embedded "chip-like" as described using FIG. 14.

The via bar 450 is coupled to the semiconductor chip 10 by the front side redistribution layer 61. Thus, the transmission lines available in the front side redistribution layer 61 provide low-loss interconnections between the semiconductor chip 10 and the antenna structure 50. A reflector 45 is disposed at the front side 6 of the semiconductor package 1. In various embodiments, the reflector 45 overlaps the antenna structure 50 at the front side 6. The radiation from the antenna structure 50 is illustrated in FIG. 15 by the arrows. In this embodiment, the embedded via bar 450 is aligned perpendicular to the main plane of the semiconductor chip 10 so that the direction of the radiation is perpendicular to the front side 6. Thus, the radiation direction is similar to the prior embodiments, for example, described in FIG. 1A.

In various embodiments, the via bar 450 may include any suitable antenna pattern. For example, in one or more embodiments, a vivaldi antenna array may be formed at the via bar 450. As described in prior embodiments, in further embodiments, a dielectric lens may be mounted over the semiconductor package 1 to further focus the antenna radiation. Further, in some embodiments, the antenna structure 50 may be oriented in a different angle within the via bar 450.

Figure 16:
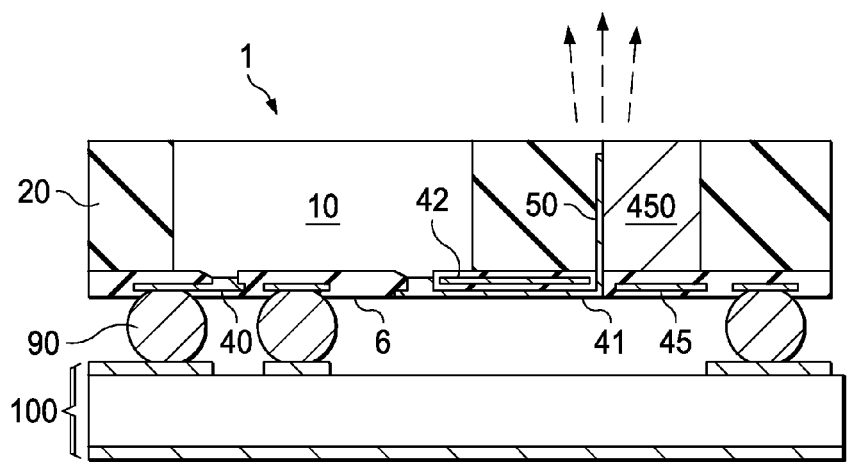
FIG. 16 describes a semiconductor package having an integrated antenna having a additional micro-strip line in accordance with an embodiment of the invention.

FIG. 16 describes a semiconductor package having an integrated antenna having a additional micro-strip line in accordance with an embodiment of the invention.

In FIG. 16, a second feeding line 42 is used to feed the antenna structure 50. Thus, any asymmetry in the radiation characteristic due to the first feeding line 41 may be minimized.

Figure 17:
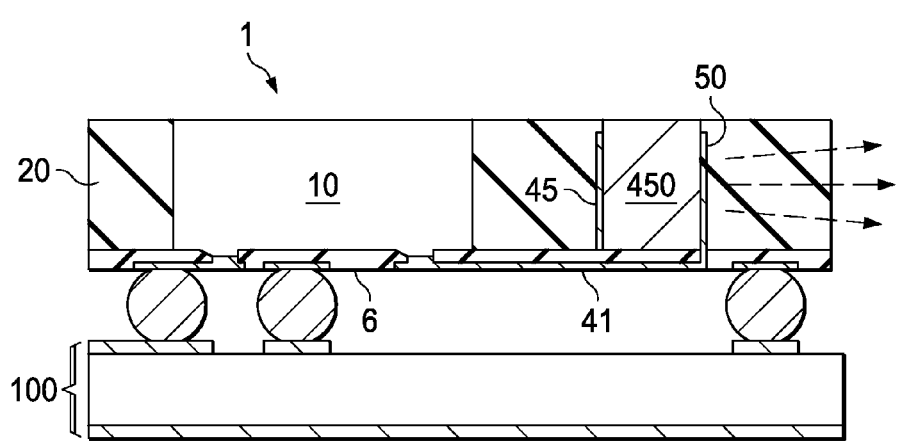
FIG. 17 illustrates a semiconductor package having a reflector integrated into the via bar in accordance with an alternative embodiment of the present invention.

FIG. 17 illustrates a semiconductor package having a reflector integrated into the via bar in accordance with an alternative embodiment of the present invention.

FIG. 17 illustrates an alternative embodiment showing radiation in a direction along the front side 6 of the semiconductor package. For example, in one or more embodiments, the antenna structure 50 may be a dipole or patch antenna structure. The reflector 45 may be included within the via bar 450 in this embodiment. Advantageously, to minimize absorption, the via bar 450 with the antenna structure 50 may be placed near the edge of the semiconductor package 1.

Figure 18A:
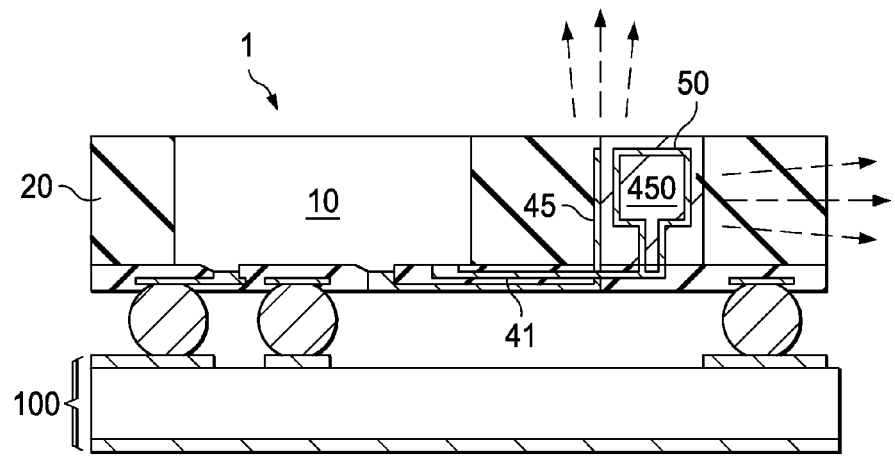
FIGS. 18A and 18B, illustrates a semiconductor package having a multi-dimensional antenna integrated into one or more via bars in accordance with an alternative embodiment of the present invention.
Figure 18B:
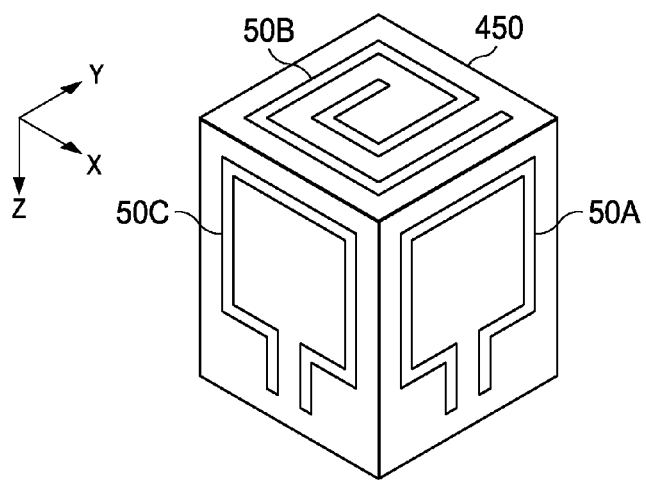

FIG. 18, which includes FIGS. 18A and 18B, illustrates a further embodiment of a semiconductor package having a multi-dimensional antenna integrated into one or more via bars in the semiconductor package.

This embodiment combines the embodiments described in FIGS. 16 and 17 to form a three dimensional antenna. Thus, in the embodiment illustrated in FIG. 18A, the antenna structure 50 may be able to radiate in multiple directions. Referring to FIG. 18B, the via bar 450 may include antenna structure 50 that includes a first axis antenna 50A, a second axis antenna 50B, and a third axis antenna 50C in one or more embodiments. This function may be split into individual via bars or/and might be combined with antenna structures described above (FIGS. 1 to 11) in various embodiments. Such three dimensional antenna structures may be advantageous for field sensing or energy transfer.

Figure 19:
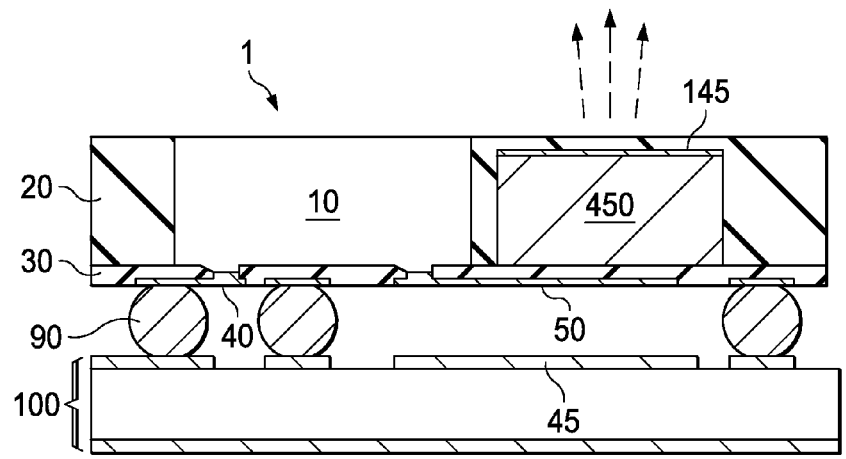
FIG. 19 illustrates a semiconductor package having a director integrated into the via bar in accordance with an alternative embodiment of the present invention.

FIG. 19 illustrates a semiconductor package having a passive antenna/director integrated into the via bar disposed parallel to surface 6 in accordance with an alternative embodiment of the present invention.

In another embodiment, the antenna structure 50 may be placed on the front side 6 of the semiconductor package 1 with a passive antenna structure 145 disposed on the opposite side on the via bar 450. A reflector 45 may be formed over the printed circuit board 100.

Figure 20A:
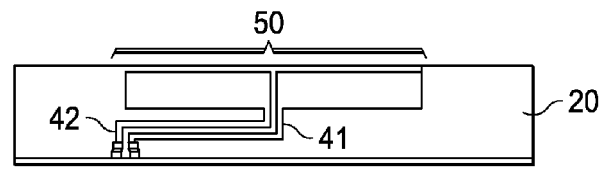
FIGS. 20A-20C, illustrates a magnified view of the antenna structures integrated into a semiconductor package in accordance with embodiments of the invention.
Figure 20B:
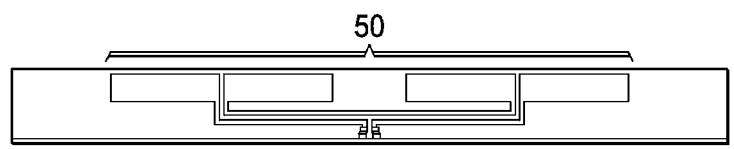
Figure 20C:
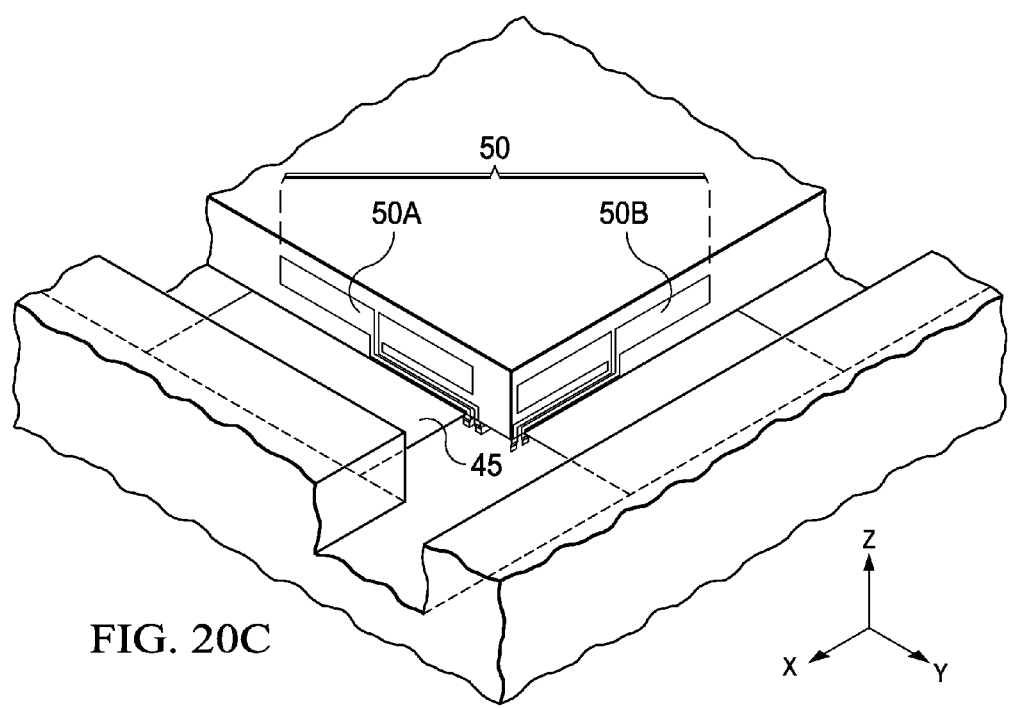

FIG. 20, which includes FIGS. 20A-20C, illustrates a magnified view of the antenna structures integrated into a semiconductor package in accordance with embodiments of the invention.

FIG. 20A illustrates a single antenna structure 50 in one embodiment of the invention disposed within the encapsulant and coupled through a first and a second feed lines 41 and 42. FIG. 20B illustrates an alternative embodiment showing an antenna structure 50 formed from an array of single antennas. FIG. 20C illustrates an alternative embodiment showing an antenna structure 50 having a first axis antenna 50A and a second axis antenna 50B.

FIG. 21, which includes FIG. 21A-21G, illustrates a semiconductor package during various stages of fabrication in accordance with an embodiment of the present invention.

Figure 21A:
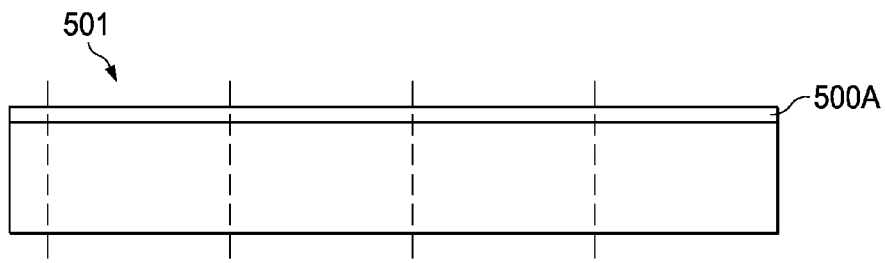
FIG. 21A-21G, illustrates a semiconductor package during various stages of fabrication in accordance with an embodiment of the present invention.
Figure 21C:
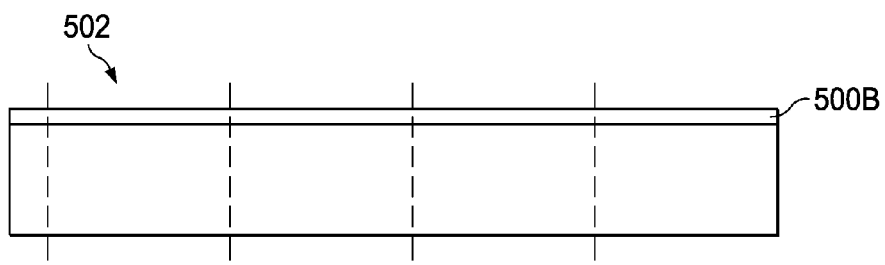
Figure 21E:
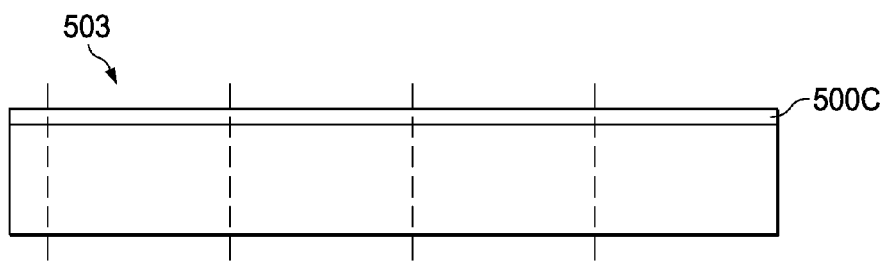
Figure 21B:
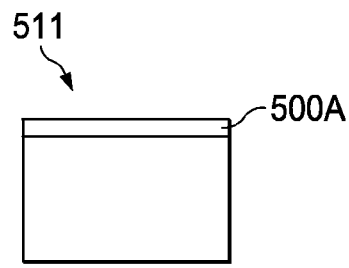

Referring to FIG. 21A, the via bars comprising the antenna structure may be individually fabricated in separate substrates. For example, a first antenna structure 500A in a first via bar substrate 501 may be fabricated using planar fabrication technologies such a printed circuit board fabrication methods and/or thin film patterning technologies. The first via bar substrate 501 is singulated to form the first via bar 511 as illustrated in FIG. 21B. In some embodiments, the first via bar substrate 501 may include another antenna structure, for example, on the back side opposite the side on which the first antenna structure 500A is formed.

Figure 21D:
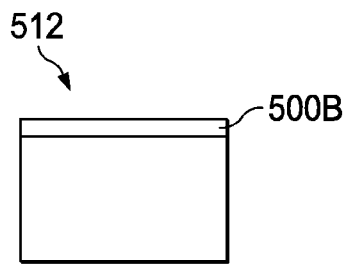
Figure 21F:
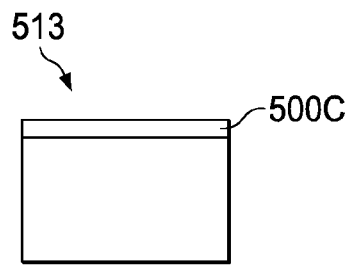

A different antenna structure may be fabricated in a different substrate in one or more embodiments. As shown in FIG. 21C, a second antenna structure 500B may be formed within a second via bar substrate 502, which is singulated to form the second via bar 512 as illustrated in FIG. 21D. Similarly, as shown in FIG. 21E, a third antenna structure 500C may be formed within a third via bar substrate 503, which is singulated to form the third via bar 513 as illustrated in FIG. 21F.

Figure 21G:
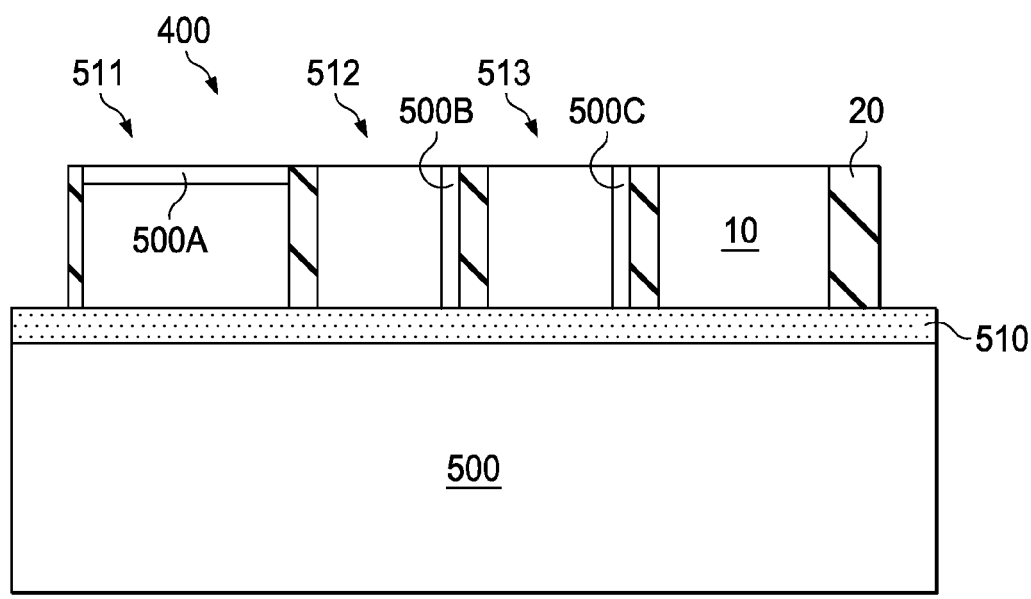

Referring to FIG. 21G, the reconstituted wafer 400 comprising a semiconductor chip 10, the first via bar 511, the second via bar 512, and the third via bar 513 may be formed. The plurality of semiconductor chips 10 is placed over a carrier 500.

Depending on the directionality of the intended antenna structure, one or more via bars may be rotated prior to the positioning over the carrier 500. A plurality of the first via bars 511, a plurality of the second via bars 512, and a plurality of the third via bars 513 are positioned accordingly over the carrier 500. As an illustration, the plurality of the second via bars 512, and the plurality of the third via bars 513 are rotated. Next, the plurality of semiconductor chips 10, the plurality of the first via bars 511, the plurality of the second via bars 512, and the plurality of the third via bars 513 are attached to the carrier 500 using an adhesive layer 510.

An encapsulant 20 is applied over the plurality of semiconductor chips 10, the plurality of the first via bars 511, the plurality of the second via bars 512, and the plurality of the third via bars 513. The encapsulant 20 may be cured to form the reconstituted wafer 400. Subsequent processing may proceed as illustrated and described using FIG. 14. Thus, in various embodiments, different antenna structures may be incorporated using one or more via bars.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-21 may be combined with each other in one or more embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package comprising:
   a substrate having a first major surface and an opposite second major surface;
   a first chip disposed in the substrate, the first chip comprising a plurality of contact pads at the first major surface;
   a first antenna structure disposed in the substrate, wherein the first antenna structure is disposed at the first major surface, and wherein the reflector is disposed at the second major surface; and
   a reflector disposed in the substrate.

2. The semiconductor package according to claim 1, further comprising:
   an encapsulant disposed around a sidewall of the first chip, the encapsulant forming the substrate; and
   through encapsulant vias disposed in the encapsulant and coupled to the plurality of contact pads.

3. The semiconductor package according to claim 2, further comprising a redistribution layer disposed over the first major surface, wherein the through encapsulant vias are coupled to the plurality of contact pads through the redistribution layer, and wherein the antenna structure is part of the redistribution layer.

4. The semiconductor package according to claim 3, further comprising a second antenna structure disposed in the redistribution layer.

5. The semiconductor package according to claim 2, further comprising an embedded heatsink disposed in the encapsulant proximate the first chip.

6. The semiconductor package according to claim 1, wherein the first antenna structure comprises a dipole antenna, a folded dipole antenna, a ring antenna, a rectangular loop antenna, a patch antenna, or a coplanar patch antenna.

7. The semiconductor package according to claim 1, wherein the first antenna structure comprises an antenna array.

8. The semiconductor package according to claim 1, further comprising a second chip comprising a passive device and/or an active device disposed proximate the first chip.

9. A semiconductor package comprising:
   a substrate having a first major surface and an opposite second major surface;
   a first chip disposed in the substrate, the first chip comprising a plurality of contact pads at the first major surface;
   a first antenna structure disposed in the substrate; and
   a reflector disposed in the substrate, wherein the antenna structure comprises a component configured to emit radiation in a direction perpendicular to the first major surface.

10. The semiconductor package according to claim 9, further comprising a second antenna structure, wherein the first antenna structure comprises a first component configured to emit radiation in a first direction perpendicular to the first major surface, and wherein the second antenna structure comprises a second component to emit radiation in a second direction parallel to first major surface.

11. A semiconductor package comprising:
   a substrate having a first major surface and an opposite second major surface;
   a first chip disposed in the substrate, the first chip comprising a plurality of contact pads at the first major surface;
   a heatsink disposed over the first chip:
   a first antenna structure disposed in the substrate; and
   a reflector disposed in the substrate.

12. A semiconductor package comprising:
   a substrate having a first major surface and an opposite second major surface;
   a first chip disposed in the substrate, the first chip comprising a plurality of contact pads at the first major surface;
   a first antenna structure disposed in the substrate;
   a dielectric lens disposed over the first antenna structure: and
   a reflector disposed in the substrate.

13. A semiconductor package comprising:
   a substrate having a first major surface and an opposite second major surface;
   a first chip disposed in the substrate, the first chip comprising a plurality of contact pads at the first major surface;

a first antenna structure disposed in the substrate;
a first via bar disposed in the substrate, wherein the first antenna structure is disposed within the first via bar; and
a reflector disposed in the substrate.

14. The semiconductor package according to claim 13, further comprising a second antenna structure disposed within the first via bar.

15. The semiconductor package according to claim 13, further comprising:
a second via bar disposed in the substrate;
a second antenna structure disposed within the second via bar; and
a third antenna structure disposed in the package.

16. A semiconductor system comprising:
a semiconductor package comprising
a substrate comprising an encapsulant, the substrate having a first major surface and an opposite second major surface,
a chip disposed in the substrate, the chip comprising a plurality of contact pads at the first major surface,
a first antenna structure proximate the first major surface,
a reflector proximate the second major surface, and
a plurality of external contacts at the second major surface; and
a printed circuit board having a front side and back side, the printed circuit board comprising
contact pads at the front side electrically coupled to the plurality of external contacts, wherein the front side faces the second major surface of the semiconductor package.

17. The semiconductor system according to claim 16, wherein the printed circuit board further comprises:
thermal contact pads at the front side thermally coupled to the second major surface of the substrate;
a backplate disposed at the back side of the printed circuit board; and
a plurality of through vias coupling the thermal contact pads with the backplate.

18. The semiconductor system according to claim 16, further comprising through encapsulant vias disposed in the encapsulant and coupled to the plurality of contact pads, wherein the encapsulant is disposed around a sidewall of the chip.

19. The semiconductor system according to claim 16, further comprising:
a plurality of solder balls disposed on the plurality of external contacts; and
a plurality of thermal solder balls disposed on the reflector, wherein the semiconductor package is attached to the printed circuit board using the plurality of solder balls and the plurality of thermal solder balls.

20. A method of forming a semiconductor package, the method comprising:
forming a reconstituted substrate comprising a first chip embedded in an encapsulant, the reconstituted substrate comprising a first major surface and an opposite second major surface, the first chip comprising a plurality of contact pads at the first major surface;
forming a front side redistribution layer over the first major surface of the reconstituted substrate, the front side redistribution layer comprising an antenna structure; and
forming a back side redistribution layer under the second major surface of the reconstituted substrate, the back side redistribution layer comprising a reflector.

21. The method of claim 20, wherein forming the back side redistribution layer comprises forming a plurality of external contacts at the second major surface.

22. The method of claim 21, further comprising
forming a plurality of solder balls on the plurality of external contacts; and
forming a plurality of thermal solder balls on the second major surface.

23. The method of claim 20, further comprising embedding via bars, passives, and/or dies in the encapsulant of the reconstituted substrate.

24. The method of claim 20, wherein forming the reconstituted substrate comprises embedding a heatsink in the encapsulant.

25. The method of claim 20, further comprising forming a dielectric lens over the antenna structure.

26. A method of forming a semiconductor package, the method comprising:
forming a substrate having a first major surface and an opposite second major surface, the substrate comprising a first chip, the first chip comprising a plurality of contact pads at the first major surface;
forming a first antenna structure in the substrate, wherein forming the first antenna structure comprises forming the first antenna structure within a first redistribution layer at the first major surface; and
forming a reflector in the substrate.

27. The method of claim 26, wherein forming the reflector comprises forming the reflector within a second redistribution layer at the second major surface.

28. A method of forming a semiconductor package, the method comprising:
forming a substrate having a first major surface and an opposite second major surface, the substrate comprising a first chip, the first chip comprising a plurality of contact pads at the first major surface;
forming a first antenna structure in the substrate, wherein forming the first antenna structure comprises forming the first antenna structure within a via bar, the via bar being formed within the substrate; and
forming a reflector in the substrate.

* * * * *